US012604554B2

(12) United States Patent
Onuki

(10) Patent No.: US 12,604,554 B2
(45) Date of Patent: Apr. 14, 2026

(54) PHOTOELECTRIC CONVERSION APPARATUS, PHOTOELECTRIC CONVERSION SYSTEM, AND MOVING OBJECT

(71) Applicant: CANON KABUSHIKI KAISHA, Tokyo (JP)

(72) Inventor: Yusuke Onuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1067 days.

(21) Appl. No.: 17/211,262

(22) Filed: Mar. 24, 2021

(65) Prior Publication Data

US 2021/0305303 A1 Sep. 30, 2021

(30) Foreign Application Priority Data

| Mar. 31, 2020 | (JP) | ................................. | 2020-063833 |
| Nov. 18, 2020 | (JP) | ................................. | 2020-191737 |
| Feb. 5, 2021 | (JP) | ................................. | 2021-017514 |

(51) Int. Cl.
*H10F 39/00* (2025.01)
*B60W 30/09* (2012.01)
(Continued)

(52) U.S. Cl.
CPC ........... *H10F 39/809* (2025.01); *B60W 30/09* (2013.01); *H01L 24/08* (2013.01); *H01L 24/09* (2013.01); *H10F 39/107* (2025.01); *B60W 2554/80* (2020.02); *H01L 2224/08145* (2013.01); *H01L 2224/0916* (2013.01);
(Continued)

(58) Field of Classification Search
CPC ..... H10F 39/809; H10F 39/107; H01L 24/08; H01L 24/09
See application file for complete search history.

(56) References Cited

U.S. PATENT DOCUMENTS

| 2009/0212336 A1 | 8/2009 | Iwata |
| 2015/0054110 A1 | 2/2015 | Kashihara |
| | (Continued) | |

FOREIGN PATENT DOCUMENTS

| CN | 108632544 A | 10/2018 |
| CN | 109585474 A | 4/2019 |
| | (Continued) | |

*Primary Examiner* — Nathan W Ha
(74) *Attorney, Agent, or Firm* — Canon U.S.A., Inc. IP Division

(57) ABSTRACT

A photoelectric conversion apparatus includes a first chip having a first semiconductor element layer including a pixel region of a plurality of pixel circuits, and a second chip having a second semiconductor element layer. The first and second chips are bonded by a plurality of metal bonding portions between the first and second semiconductor element layers. The plurality of metal bonding portions includes first and second metal bonding portions disposed in a region overlapping with the pixel region in a plan view. The first metal bonding portion connects at least either one of the plurality of pixel circuits and the second semiconductor element layer. The second metal bonding portion is connected to at least either one of the plurality of pixel circuits and is not connected to the second semiconductor element layer in the region overlapping with the pixel region.

27 Claims, 36 Drawing Sheets

(51) Int. Cl.
   *H01L 23/00*          (2006.01)
   *H10F 39/10*          (2025.01)
(52) U.S. Cl.
   CPC ............... *H01L 2224/09517* (2013.01); *H01L 2224/09519* (2013.01); *H10F 39/8023* (2025.01); *H10F 39/811* (2025.01)

(56)                References Cited

U.S. PATENT DOCUMENTS

| | | | |
|---|---|---|---|
| 2018/0240797 A1 | 8/2018 | Yokoyama et al. | |
| 2019/0104270 A1 | 4/2019 | Sakurai | |
| 2019/0252444 A1 | 8/2019 | Ryoki | |
| 2019/0273108 A1 | 9/2019 | Sato et al. | |
| 2020/0075646 A1* | 3/2020 | Onuki | H01L 28/60 |
| 2020/0135786 A1* | 4/2020 | Onuki | H01L 27/14636 |
| 2021/0399031 A1* | 12/2021 | Kobayashi | H01L 27/14634 |

FOREIGN PATENT DOCUMENTS

| | | |
|---|---|---|
| JP | 2018-182038 A | 11/2018 |
| JP | 2019-068265 A | 4/2019 |
| JP | 2019-140253 A | 8/2019 |
| WO | 2018/189994 A1 | 10/2018 |
| WO | 2020/044943 A | 3/2020 |

* cited by examiner

FIG.15

FRONT VIEW

TOP VIEW

REAR VIEW

GND

126B

126A

126C

126D

126E

1

PHOTOELECTRIC CONVERSION APPARATUS, PHOTOELECTRIC CONVERSION SYSTEM, AND MOVING OBJECT

BACKGROUND

Field

The present invention relates to a photoelectric conversion apparatus, a photoelectric conversion system, and a moving object.

Description of the Related Art

A photoelectric conversion apparatus is known to include chips stacked in layers that are a chip having pixel circuits and a chip having electrical circuits for processing signals from the pixel circuits. Japanese Patent Laid-Open No. 2019-068265 discusses a photoelectric conversion apparatus including chips stacked in layers that are a chip having a plurality of pixel circuits and a chip having a plurality of electrical circuits.

The photoelectric conversion apparatus discussed in Japanese Patent Application Laid-Open No. 2019-068265 includes conductive members that electrically connect pixel circuits and electrical circuits and bond the chip having pixel circuits and the chip having electrical circuits with each other. In Japanese Patent Laid-Open No. 2019-068265, the number of conductive members is smaller than the number of pixel circuits. More specifically, in a pixel region where pixel circuits are arranged in an array form, one conductive member is selectively disposed for a plurality of pixel circuits. Therefore, some pixel circuits are provided with a conductive member and other pixel circuits are not provided with a conductive member.

Each conductive member connects pixel circuits and electrical circuits via metal wirings. Generally, since a metal wiring has high thermal conductivity relative to an interlayer insulating film, a large amount of heat transfers in a conductive member. Meanwhile, in a pixel circuit not provided with a conductive member, the heat generated in at least either one of a photoelectric conversion element and a signal processing circuit hardly transfers in comparison with a pixel circuit provided with a conductive member. Consequently, an uneven heat transfer occurs between the pixel circuit provided with a conductive member and the pixel circuit not provided with a conductive member.

SUMMARY

The present invention is directed to reducing an uneven heat transfer in a photoelectric conversion apparatus including a plurality of stacked semiconductor element layers.

The present invention in its first aspect provides a photoelectric conversion apparatus comprising: a first chip having a first semiconductor element layer including a pixel region where a plurality of pixel circuits is disposed; and a second chip having a second semiconductor element layer, wherein the first chip and the second chip are bonded by a plurality of metal bonding portions between the first semiconductor element layer and the second semiconductor element layer, wherein the plurality of metal bonding portions includes a first metal bonding portion and a second metal bonding portion that are disposed in a region overlapping with the pixel region in a plan view, wherein the first metal bonding portion connects at least either one of the plurality of pixel circuits and the second semiconductor element layer, and wherein the second metal bonding portion is connected to at least either one of the plurality of pixel circuits and is not connected to the second semiconductor element layer in the region overlapping with the pixel region in the plan view.

The present invention in its second aspect provides a photoelectric conversion apparatus comprising: a first chip having a first semiconductor element layer including a pixel region where a plurality of pixel circuits is disposed; and a second chip having a second semiconductor element layer, wherein the first chip and the second chip are bonded by a plurality of metal bonding portions between the first and the second semiconductor element layers, wherein the plurality of metal bonding portions includes a first metal bonding portion and a second metal bonding portion that are disposed in a region overlapping with the pixel region in a plan view, wherein the first metal bonding portion connects at least either one of the plurality of pixel circuits and the second semiconductor element layer, and wherein the second metal bonding portion is connected to the second semiconductor element layer and is connected to none of the plurality of pixel circuits in the region overlapping with the pixel region in the plan view.

The present invention in its third aspect provides a photoelectric conversion apparatus comprising: a first chip having a first semiconductor element layer including a plurality of pixel circuits; and a second chip having a second semiconductor element layer, wherein the first chip and the second chip are bonded by a plurality of metal bonding portions between the first semiconductor element layer and the second semiconductor element layer, wherein the plurality of metal bonding portions includes a first metal bonding portion and a second metal bonding portion, wherein the first metal bonding portion connects at least either one of the plurality of pixel circuits and the second semiconductor element layer, and wherein one fourth wiring pattern is disposed between four or more of the second metal bonding portions of the plurality of metal bonding portions and the first semiconductor element layer, and the one fourth wiring pattern is connected to each of the four or more of the second metal bonding portions, or one second wiring pattern is disposed between the four or more of the second metal bonding portions of the plurality of metal bonding portions and the second semiconductor element layer, and the one second wiring pattern is connected to each of the four or more second metal bonding portions.

The present invention in its fourth aspect provides a photoelectric conversion apparatus comprising: a first chip having a first semiconductor element layer including a plurality of pixel circuits; and a second chip having a second semiconductor element layer, wherein the first chip and the second chip are bonded by a plurality of metal bonding portions between the first semiconductor element layer and the second semiconductor element layer, wherein the plurality of metal bonding portions includes a first metal bonding portion and a second metal bonding portion, wherein the first metal bonding portion connects at least either one of the plurality of pixel circuits and the second semiconductor element layer, wherein either one of a surface of the second metal bonding portion on a side of the first semiconductor element layer and a surface of the second metal bonding portion on a side of the second semiconductor element layer is connected to a fourth wiring pattern disposed between the first semiconductor element layer and the second metal bonding portion or to a second wiring pattern disposed between the second semiconductor element layer and the second metal bonding portion, and wherein an entire surface of the second metal bonding portion other than the surface of the second metal bonding portion on the side of the first semiconductor element layer and the surface of the second metal bonding portion on the side of the second semiconductor element layer is in contact with an insulating material.

The present invention in its fifth aspect provides a photoelectric conversion system comprising: the photoelectric conversion apparatus as specified as any one of the first to fourth aspect of the present invention; and a signal processing unit configured to process a signal obtained by the photoelectric conversion apparatus.

The present invention in its sixth aspect provides a moving object comprising: the photoelectric conversion apparatus as specified as any one of the first to fourth aspect of the present invention; a distance information acquisition unit configured to acquire information about a distance to a target based on a signal from the photoelectric conversion apparatus; and a control unit configured to control the moving object based on the distance information.

Further features of the present invention will become apparent from the following description of embodiments with reference to the attached drawings.

BRIEF DESCRIPTION OF THE DRAWINGS

FIG. 15 is a block diagram illustrating a photoelectric conversion system according to a sixth embodiment.

FIGS. 19A to 19E are schematic diagrams illustrating plan views of a wiring layer according to a ninth embodiment.

DESCRIPTION OF THE EMBODIMENTS

Figure 1:
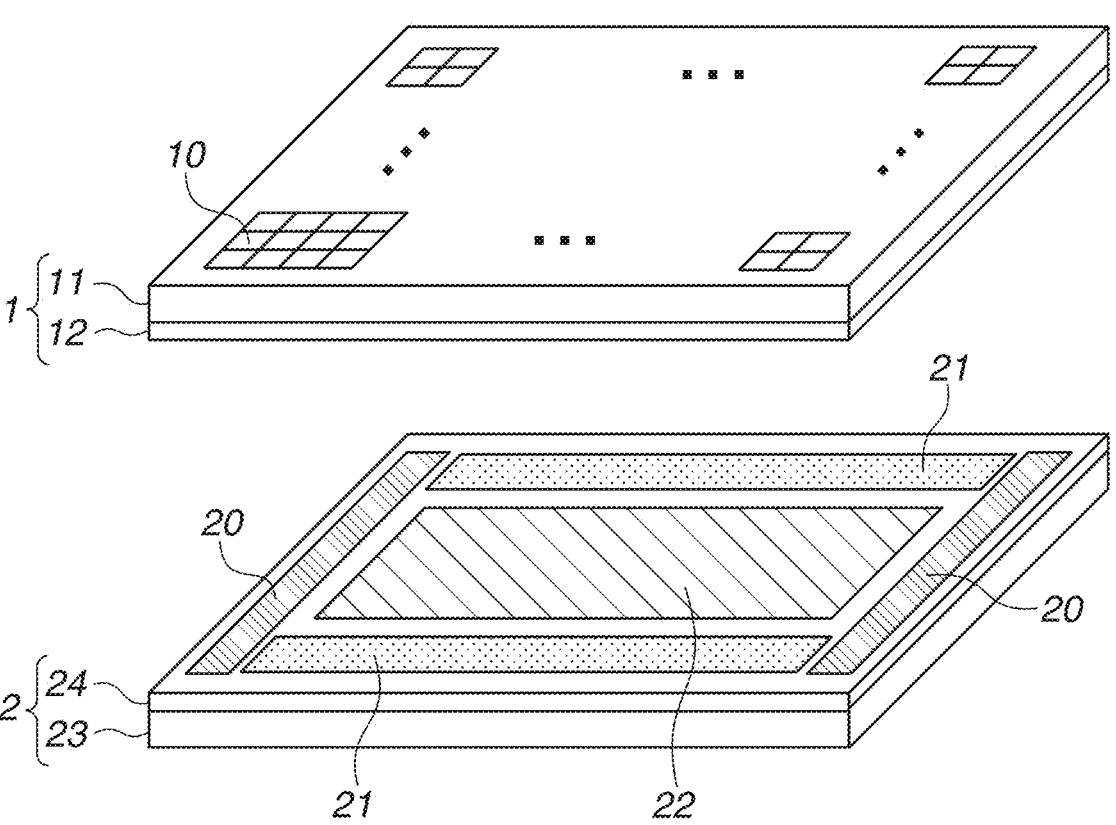
FIG. 1 is a perspective view schematically illustrating a configuration of a photoelectric conversion apparatus.

The following embodiments are directed to embodying the technical concept of the present invention, but do not limit the present invention. Sizes and positional relations of members illustrated in each drawing may be exaggerated to make descriptions clear. In the following descriptions, identical components are assigned the same reference numerals and redundant descriptions thereof may be omitted.

FIG. 1 illustrates a photoelectric conversion apparatus according to each embodiment. The photoelectric conversion apparatus is a semiconductor device that can be used as, for example, an image sensor, a light metering sensor, or a distance measurement sensor.

The photoelectric conversion apparatus has a laminated structure including a chip 1 and a chip 2. The chip 1 includes a semiconductor element layer 11 (first semiconductor element layer) including pixel circuits in pixels 10, and a wiring structure 12 (first wiring structure). According to the present specification, a "semiconductor element layer" includes not only a semiconductor layer but also a semiconductor layer and the gates of transistors formed on the semiconductor layer. A "semiconductor element layer" does not include a wiring layer in a wiring structure. The chip 2 includes a wiring structure 24 (second wiring structure) and a semiconductor element layer 23 (second semiconductor element layer) including electrical circuits. As described below, the wiring structure 12 of the chip 1 and the wiring structure 24 of the chip 2 are bonded by metal bonding portions formed by bonding wiring layers included in the two wiring structures. A metal bonding portion refers to a structure in which the metal forming one wiring layer is directly bonded with the metal included in the other wiring layer.

As described in detail below, elements forming the pixels 10 are arranged in the semiconductor element layer 11. A part of configurations of the pixels 10 may be disposed in the semiconductor element layer 11, and the other part thereof may be disposed in the semiconductor element layer 23. In this case, the configurations of pixel circuits in the pixels 10 that are disposed in the semiconductor element layer 11 are photoelectric conversion elements, such as photodiodes. Pixel circuits including photoelectric conversion elements are disposed in the semiconductor element layer 11 in a two-dimensional array in a plan view. According to the present specification, "plan view" refers to viewing from a direction perpendicular to the bonding surface between the chips 1 and 2. The semiconductor element layer 11 has a pixel region where a plurality of pixel circuits is disposed in a two-dimensional array. In FIG. 1, a plurality of photoelectric conversion elements included in the plurality of pixel circuits are provided in a two-dimensional array in the row and column directions in the semiconductor element layer 11.

The wiring structure 12 includes M wiring layers (M is one or a larger integer) and interlayer insulation materials. The wiring structure 24 includes N wiring layers (N is one or a larger integer) and interlayer insulation materials.

The semiconductor element layer 23 includes electrical circuits. In FIG. 1, for the convenience of description, the configurations illustrated on the upper surface of the chip 2 are configurations disposed on the semiconductor element layer 23. An electrical circuit refers to either one of transistors including, for example, a row scanning circuit 20, a column scanning circuit 21, and a signal processing circuit 22 illustrated in FIG. 1. The signal processing circuit 22 refers to at least either one or a combination of a part of the configuration of the pixel 10 (such as an amplification transistor, a selection transistor, and a reset transistor), an amplification circuit, a selection circuit, a logical calculation circuit, an analog-to-digital (A/D) conversion circuit, a memory, and a circuit for compression or combining processing.

The pixel 10 may refer to the minimum unit of a circuit that is repetitively arranged to form an image. Each of pixel circuits included in the pixels 10 and disposed in the semiconductor element layer 11 only needs to include at least a photoelectric conversion element. A pixel circuit may include configurations other than a photoelectric conversion element. For example, a pixel circuit may further include at least either one of a transfer transistor, a floating diffusion (FD), a reset transistor, an amplification transistor, a capacitance addition transistor, and a selection transistor. Typically, the pixel 10 includes a selection transistor and a group of elements connected to signal lines via the selection transistor. More specifically, the selection transistor can be an outer edge of the pixel circuit. Alternatively, the pixel 10 may be configured with a set of a photoelectric conversion element and a transfer transistor. Yet alternatively, the pixel 10 may be configured with a set of one or a plurality of photoelectric conversion elements and one amplification circuit or one A/D conversion circuit.

Figure 2:
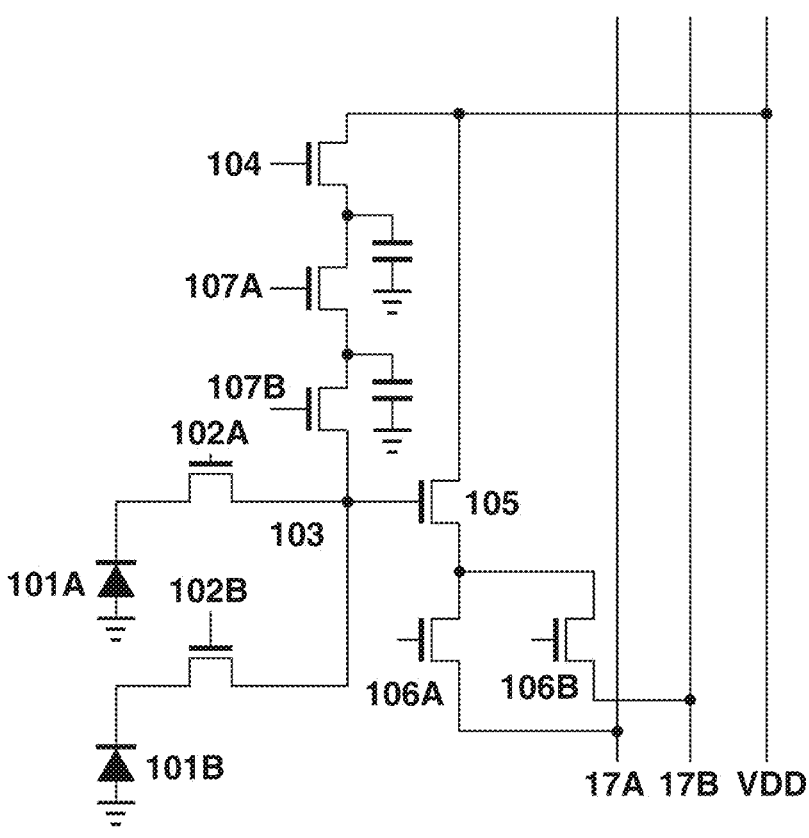
FIG. 2 is a diagram illustrating a pixel circuit.

Referring to FIG. 2, a pixel circuit includes photoelectric conversion elements 101A and 101B, transfer transistors 102A and 102B, an FD 103, a reset transistor 104, an amplification transistor 105, selection transistors 106A and 106B, and capacitance addition transistors 107A and 107B. One pixel circuit may include a plurality of photoelectric conversion elements as illustrated in FIG. 2 or include one photoelectric conversion element.

Each configuration included in the pixel circuit will be described below. In the following description, indexes such as A and B will be omitted if the description is commonly applied.

The photoelectric conversion element 101 generates electrons and holes through photoelectric conversion. For example, a photodiode can be used as the photoelectric conversion element 101. The transfer transistor 102 controls whether to transfer a signal charge generated in the photoelectric conversion element 101 to the FD 103. The reset transistor 104 controls whether to set a potential of the FD 103 and a potential of the photoelectric conversion element 101 to the reference potential. The capacitance addition transistor 107 controls whether to add a capacitance to the FD 103. The amplification transistor 105 amplifies a signal based on signal charges transferred to the FD 103 and then outputs the signal. The selection transistor 106 is connected to the amplification transistor 105 and an output line 17.

When the selection transistor 106 turns ON, the signal output from the amplification transistor 105 is transmitted to the output line 17. In a case where the pixel circuit includes no selection transistor, the ON/OFF state of the amplification transistor 105 is controlled to control whether to output the signal to the output line 17. The output line 17 is connected to the signal processing circuit 22 illustrated in FIG. 1. The gates of the transfer transistor 102, the reset transistor 104, the amplification transistor 105, the selection transistor 106, and the capacitance addition transistor 107 are supplied with a signal from the row scanning circuit 20 illustrated in FIG. 1, whereby the ON/OFF state of each transistor is controlled.

There may be provided with the rolling shutter function or the global shutter function. The rolling shutter function sequentially reads each row from a side of the pixel region to the facing side. The global shutter function simultaneously transfers and accumulates charges over the entire pixel region. In a pixel region, the exposure time may be different for each block including a plurality of pixels. In this case, it is preferable that the number of metal bonding portions 30B is larger than the number of metal bonding portions 30A in each block, e.g. as in FIG. 3.

In the following embodiments, the pixel circuit illustrated in FIG. 2 is disposed in the chip 1. Since the area of the photoelectric conversion element 101 can be secured without increasing the area of the chip 1, configurations other than the photoelectric conversion element 101 of the pixel may be disposed on the chip 2.

Figure 3:
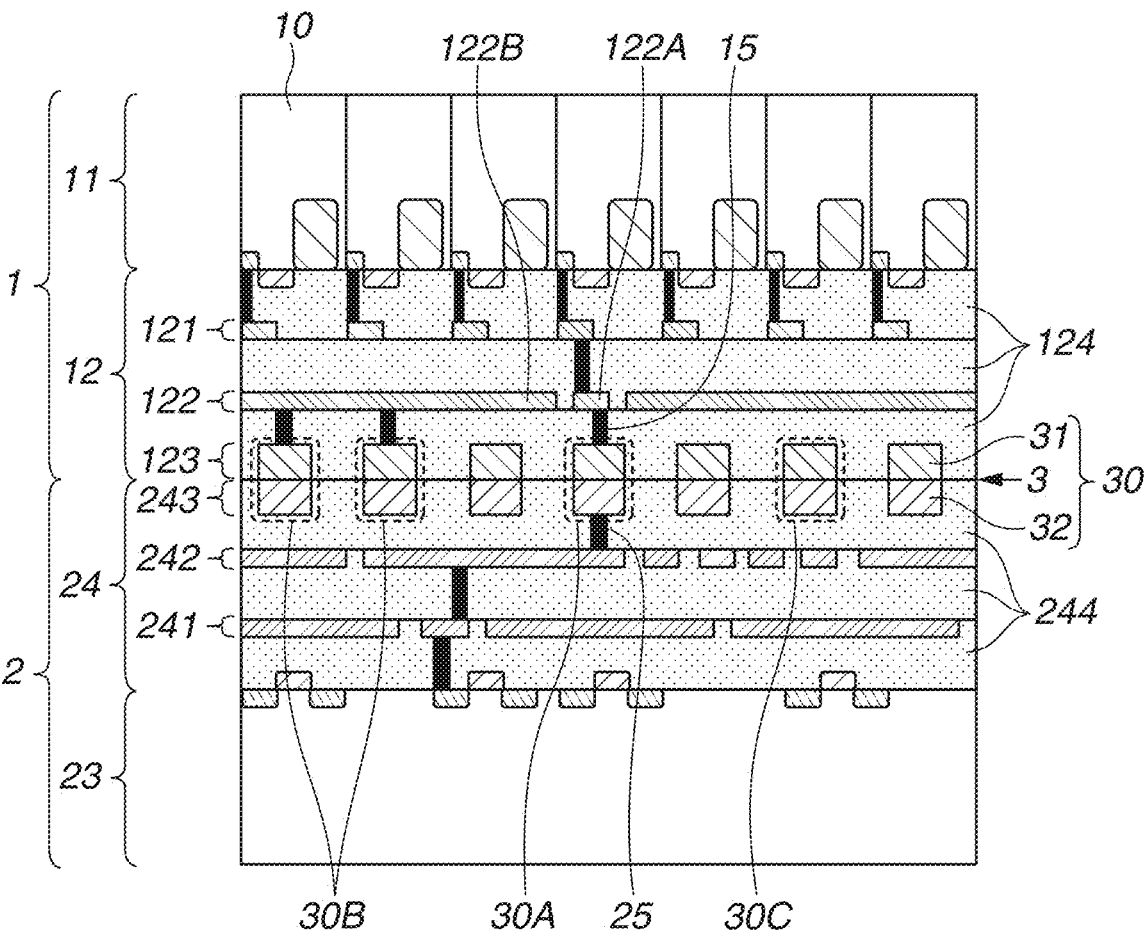
FIG. 3 is a cross-sectional view schematically illustrating the photoelectric conversion apparatus.

FIG. 3 is a cross-sectional view schematically illustrating a concept of the structure of the photoelectric conversion apparatus. The chips 1 and 2 are bonded in layers on a bonding surface 3. The wiring structure 12 of the chip 1 and the wiring structure 24 of the chip 2 are positioned between the semiconductor element layer 11 of the chip 1 and the semiconductor element layer 23 of the chip 2. In FIG. 3, the wiring structure 12 includes three different wiring layers 121, 122, and 123, and the wiring structure 24 includes three different wiring layers 241, 242, and 243. Interlayer insulation materials 124 and 244 are disposed between the wiring layers.

Each wiring layer includes one or a plurality of wiring patterns, and insulating materials disposed between the wiring patterns. For example, the wiring layer 122 includes a wiring pattern 122A (first wiring pattern) and a wiring pattern 122B (second wiring pattern). Wiring patterns included in each wiring layer are wiring patterns existing in the same layer. According to the present specification, two different wiring patterns existing in the same layer may be referred to as a wiring pattern XA and a wiring pattern XB. From one point of view, the wiring patterns XA and XB may transmit different potentials. From another point of view, the wiring patterns XA and XB may be separated from each other on the plane of the wiring layer where the two wiring patterns are disposed. For example, the wiring patterns XA and XB are separated from each other by the insulating material disposed therebetween. In this case, the wiring patterns XA and XB may form one wiring. In other words, the wiring patterns XA and XB separated from each other in a certain wiring layer may be electrically connected with each other via wiring patterns in another wiring layer.

According to the present embodiment, the wiring pattern 122A is electrically connected to the gate of the amplification transistor in a certain pixel circuit. The wiring pattern 122B is electrically connected to a configuration other than the gate of the amplification transistor in the pixel circuit disposed in the semiconductor element layer 11. For example, the wiring pattern 122B supplies the power voltage to the reset transistor and the amplification transistor. The wiring pattern 122B may supply the ground voltage to the photoelectric conversion element.

The wiring patterns in the wiring layers 121, 122, 123, 241, 242, and 243 are formed of metal materials. It is desirable that copper is the primary component of the wiring patterns in the wiring layers 121, 122, 123, 241, 242, and 243. This means that copper occupies more than 50% of the entire component. For the wiring layers 121, 122, 123, 241, 242, and 243, it is desirable that copper occupies more than 90% of the entire component. Each wiring layer may be formed of a metal such as aluminum, tungsten or a combination thereof. The wiring layers 123 and 243 including wiring patterns that form metal bonding portions may be mainly made of copper, and wiring layers other than the wiring layers 123 and 243 may be mainly made of a metal such as aluminum, tungsten or a combination thereof. Via plugs for connecting the wiring layers, and contact plugs for connecting wiring layers and the gates of transistors or connecting wiring layers and semiconductor element layers are also made of a metal, such as copper, aluminum, tungsten or a combination thereof.

The wiring patterns in the wiring layers 123 and 243 are embedded in a recessed portion in interlayer insulating layers. The wiring patterns in the wiring layers 123 and 243 can be formed by using a damascene process. The metal bonding sub-portions 31 of the wiring pattern in the wiring layer 123 and the metal bonding sub-portions 32 of the wiring pattern in the wiring layer 243 are bonded to form the metal bonding portions 30.

According to the present embodiment, some or all of the plurality of the metal bonding portions 30 are classified into either one of three different types: a metal bonding portion 30A (first metal bonding portion), a metal bonding portion 30B (second metal bonding portion), and a metal bonding portion 30C (third metal bonding portion). The plurality of the metal bonding portions 30 may include metal bonding portions of different types from these types.

The metal bonding portion 30A is disposed in a region overlapping with the pixel region in a plan view. The metal bonding portion 30A connects a pixel circuit disposed in the semiconductor element layer 11 and the semiconductor element layer 23. In FIG. 3, the metal bonding portion 30A connects the source or drain of the selection transistor 106 of a pixel circuit and an electrical circuit disposed in the semiconductor element layer 23. The signal from the photoelectric conversion element is transmitted to the electrical circuit of the semiconductor element layer 23 via the metal bonding portion 30A. The metal bonding portion 30A and the wiring layers 122 and 242 are connected via via plugs 15 and 25 as illustrated in FIG. 3. However, the metal bonding portion 30A and the wiring layers 122 and 242 may be connected without using via plugs. More specifically, the metal bonding portion 30A and at least either one of the wiring layers 122 and 242 may be connected through direct contact. The via plugs 15 may be integrally formed with the wiring pattern in the wiring layer 123 that forms the metal bonding portion 30A. The via plug 25 may be integrally formed with the wiring pattern in the wiring layer 243 forming the metal bonding portion 30A. Wiring patterns and via plugs can be integrally formed by using the dual damascene process. The dual damascene process is also applicable for metal bonding portions other than the metal bonding portion 30A.

The metal bonding portion 30B is electrically connected to either one of the semiconductor element layers 11 and 23 in a region overlapping with the pixel region in a plan view. The contact plug in contact with either one of the semiconductor element layers 11 and 23 to connect the metal bonding portion 30B to the either one of the semiconductor element layers 11 and 23 is not illustrated in FIG. 3. The metal bonding portion 30B is not connected to the other of the semiconductor element layers 11 and 23 at least in a region overlapping with the pixel region in a plan view. A state where the metal bonding portion 30B is not electrically connected to the other of the semiconductor element layers 11 and 23 in a pixel region refers to a state where the metal bonding portion 30B is not electrically connected to the other of the semiconductor element layers 11 and 23 in a region overlapping with the pixel region in a plan view. In other words, in a region overlapping with the pixel region in a plan view, none of contact plugs in contact with the other of the semiconductor element layers 11 and 23 are electrically continuous to the metal bonding portion 30B. Meanwhile, the present invention includes a configuration in which the metal bonding portion 30B is connected to the other of the semiconductor element layers 11 and 23 in a region not overlapping with the pixel region in a plan view. For example, in FIG. 3, the present invention includes a configuration in which a ground voltage is supplied from a region of the semiconductor element layer 23 not overlapping with the pixel region to the wiring pattern 122B via wiring patterns. In FIG. 3, the metal bonding portions 30B is connected to the semiconductor element layer 11 but is not connected to the semiconductor element layer 23 in a region overlapping with the pixel region in a plan view. The metal bonding portion 30B may be connected to both of the wiring layers 122 and 242 as long as the metal bonding portion 30B is not connected to either one of the semiconductor element layers 11 and 23 in a region overlapping with the pixel region in a plan view.

From another point of view, the surface of the metal bonding portion 30B on the side of the semiconductor element layer 11 is connected to a via plug, or connected to the wiring pattern in the wiring layer 122 via a via plug, and the entire surface of the metal bonding portion 30B on the side of the semiconductor element layer 23 is in contact with the insulating material. Alternatively, in a case of the metal bonding portion 30B formed by the dual damascene method, for example, the surface on the side of the semiconductor element layer 11 has a protruding portion for connection with the wiring pattern in the wiring layer 122, and the entire surface on the side of the semiconductor element layer 23 is in contact with the insulating material. In other words, the surface of the metal bonding portion 30B on side of either one of the semiconductor element layers 11 and 23 is connected to the wiring pattern, and the surface of the metal bonding portion 30B on the side of the other of the semiconductor element layers 11 and 23 is not connected to the wiring pattern. Via plugs and the metal bonding portion 30B may be made of the same material or made of different materials.

When the metal bonding portion 30B is formed based on the above-described point of view, the metal bonding portion 30B may be connected to both of the semiconductor element layers 11 and 23 in a region overlapping with the pixel region in a plan view.

Although details will be described below, connecting the metal bonding portion 30B with the pixel circuit or the semiconductor element layer 23 enables reducing an uneven heat transfer in the photoelectric conversion apparatus. Even in a case where there is one metal bonding portion 30B, the effect of reducing an uneven heat transfer can be obtained in comparison with a case where the metal bonding portion 30B is not provided. Therefore, the number and positions of the metal bonding portions 30B are not limited to the number and positions thereof described below.

The metal bonding portions 30A and 30B may be connected to either one or both of the wiring layers 122 and 243 via plugs, or connected to at least either one of the wiring layers 122 and 243 through direct contact.

The metal bonding portion 30C illustrated in FIG. 3 is electrically connected to none of the semiconductor element layers 11 and 23. The metal bonding portion 30C is used, for example, to ensure the bonding strength of each chip. The metal bonding portion 30C does not need to be provided. More specifically, the effect of reducing an uneven heat transfer can be obtained even in a case where each of the plurality of the metal bonding portions 30 is formed of either one of the metal bonding portions 30A and 30B.

First Embodiment

The photoelectric conversion apparatus according to a first embodiment will be described below with reference to FIGS. 4 to 6. The photoelectric conversion apparatus according to the first embodiment includes all of the configurations illustrated in FIGS. 1 to 3.

Figure 4:
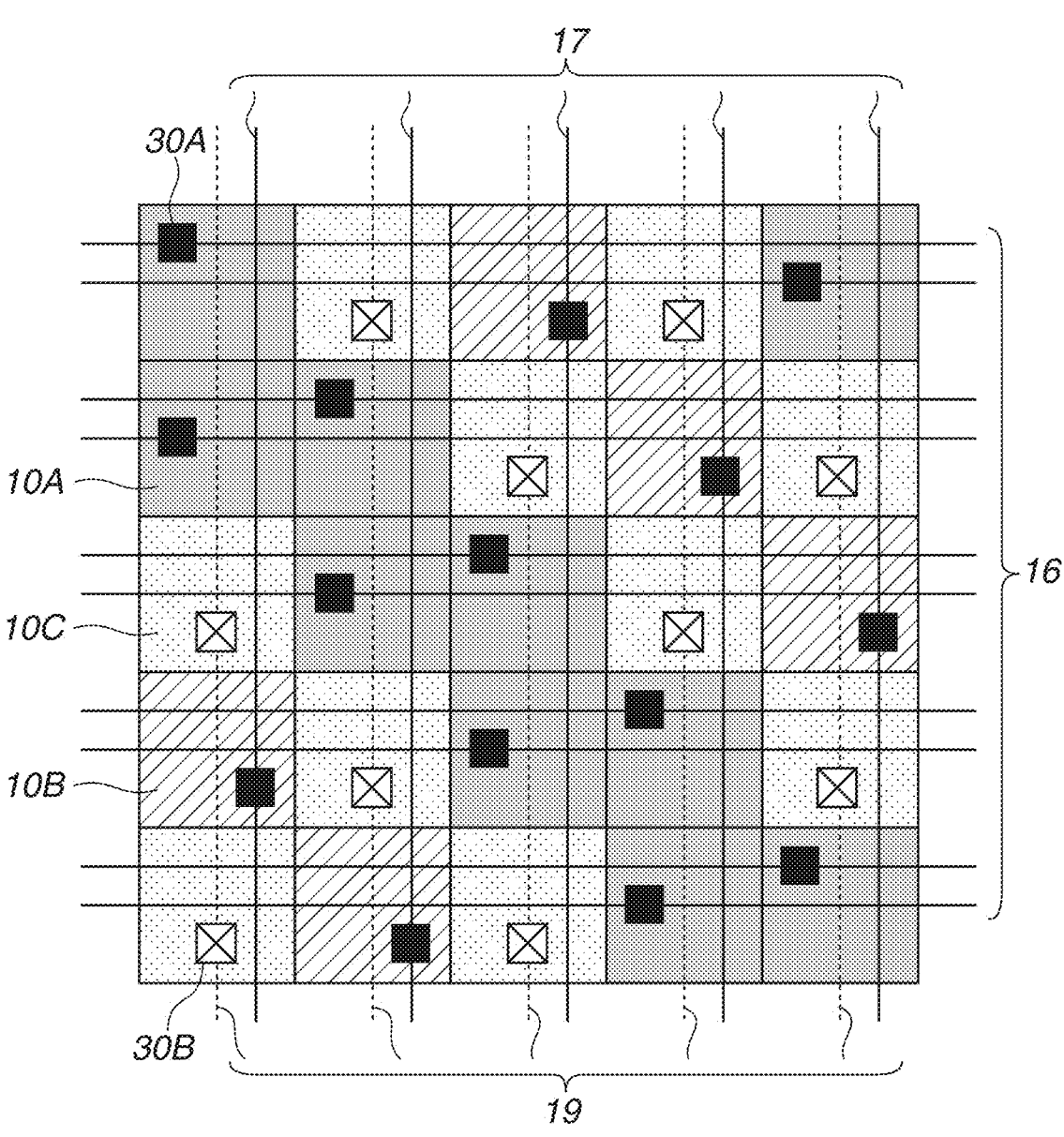
FIG. 4 is a plan view schematically illustrating arrangements of metal bonding portions according to a first embodiment.

FIG. 4 is a plan view schematically illustrating the arrangement of the metal bonding portions. To make the description simple, a pixel region where two row scanning lines 16 and one vertical output line 17 are disposed for each of the pixels 10 that are disposed in five rows by five columns. Two of the control lines connected to the gate of each transistor illustrated in FIG. 2 are illustrated as the two row scanning lines 16 illustrated in FIG. 4. One of output lines 17A and 17B illustrated in FIG. 2 is illustrated as a vertical output line 17 illustrated in FIG. 4. A wiring 19 is disposed for each row. The wiring 19 may be, for example, supplied with a fixed voltage or may be floated. A wiring supplied with a fixed voltage is, for example, a wiring supplied with the power voltage (e.g., VDD) or a wiring supplied with the ground voltage (e.g., GND). The reset line VDD illustrated in FIG. 2 is illustrated as the wiring 19 illustrated in FIG. 4.

Which wiring the metal bonding portion 30B is to be connected to can be suitably set according to the arrangement of the wiring pattern. FIG. 4 illustrates an example where the metal bonding portion 30B is connected to the wiring 19. However, the metal bonding portion 30B may be connected to the row scanning lines 16 and the vertical output lines 17 like an embodiment described below. In a case where the metal bonding portion 30C is provided, the metal bonding portion 30B can be replaced with the metal bonding portion 30C by not connecting a part of the metal bonding portion 30B to any wiring pattern.

In a pixel region where pixels 10 are arranged in five rows by five columns, at least two electric metal bonding portions 30A for electrically connecting the two row scanning lines 16 and the row scanning circuit 20 are provided for each row. Also, at least one metal bonding portion 30A for electrically connecting one vertical output line 17 and the signal processing circuit 22 is provided for each column. The metal bonding portions 30 (30A and 30B) are disposed to overlap with the configuration of the pixels 10 (e.g., pixel circuits) disposed in the chip 1, in a plan view. In other words, a plurality of the metal bonding portions 30 is disposed in a plurality of rows by a plurality of columns in a plan view. For convenience, the pixel 10 including the metal bonding portion 30A for electrically connecting the row scanning line 16 and the row scanning circuit 20 is referred to as a pixel 10A, and the pixel 10 including the metal bonding portion 30A for electrically connecting the vertical output lines 17 and the signal processing circuit 22 is referred to as a pixel 10B. Further, a pixel 10 including the metal bonding portion 30B that is connected to the semiconductor element layer 11 but is not connected to the semiconductor element layer 23 in the pixel region is referred to as a pixel 10C.

Figure 5A:
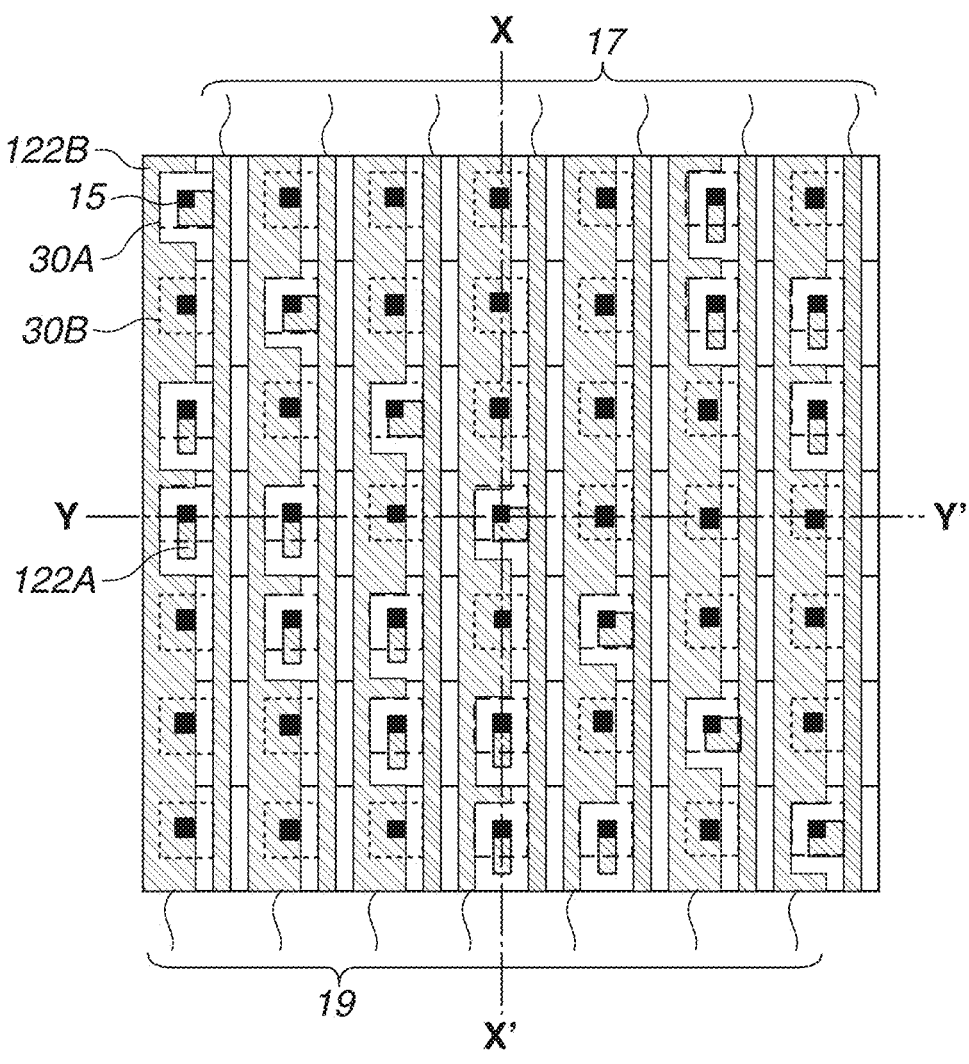
FIGS. 5A and 5B are diagrams illustrating schematic plan views.

FIG. 5A is a plan view schematically illustrating the wiring layer 122 of the chip 1, and illustrating the pixels 10 in seven rows by seven columns in the pixel region. FIG. 5A illustrates the positions of the metal bonding portions 30A and 30B and the via plugs 15 in addition to the vertical output lines 17 and wirings 19 as a wiring pattern disposed in the wiring layer 122. In FIG. 5A, the metal bonding portion 30A is drawn with long broken lines, and the metal bonding portion 30B is drawn with dotted lines. The shape of the metal bonding portion 30 is not limited to a square but may be a square with rounded corners or a circle in a plan view. The via plugs 15 connect the wiring pattern in the wiring layer 122 and the metal bonding portion 30.

Figure 5B:
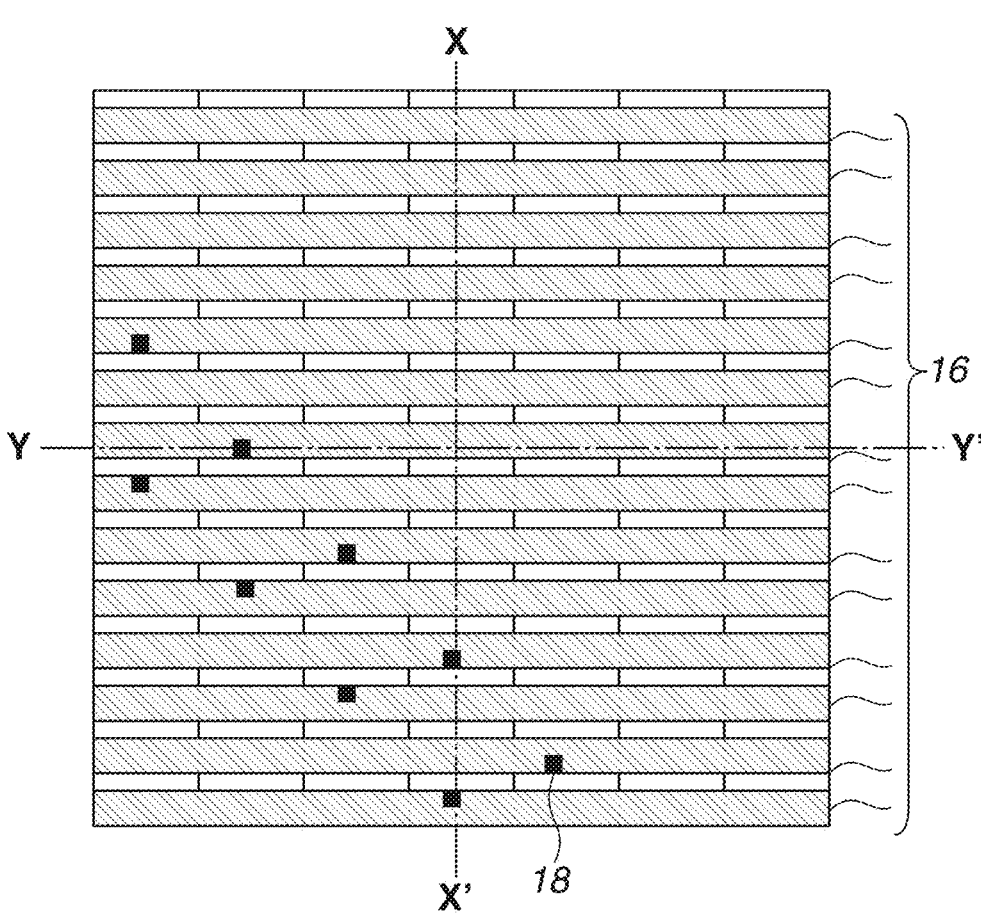

FIG. 5B is a plan view schematically illustrating the wiring layer 121 of the chip 1, including the row scanning line 16 and via plugs 18.

Figure 5C:
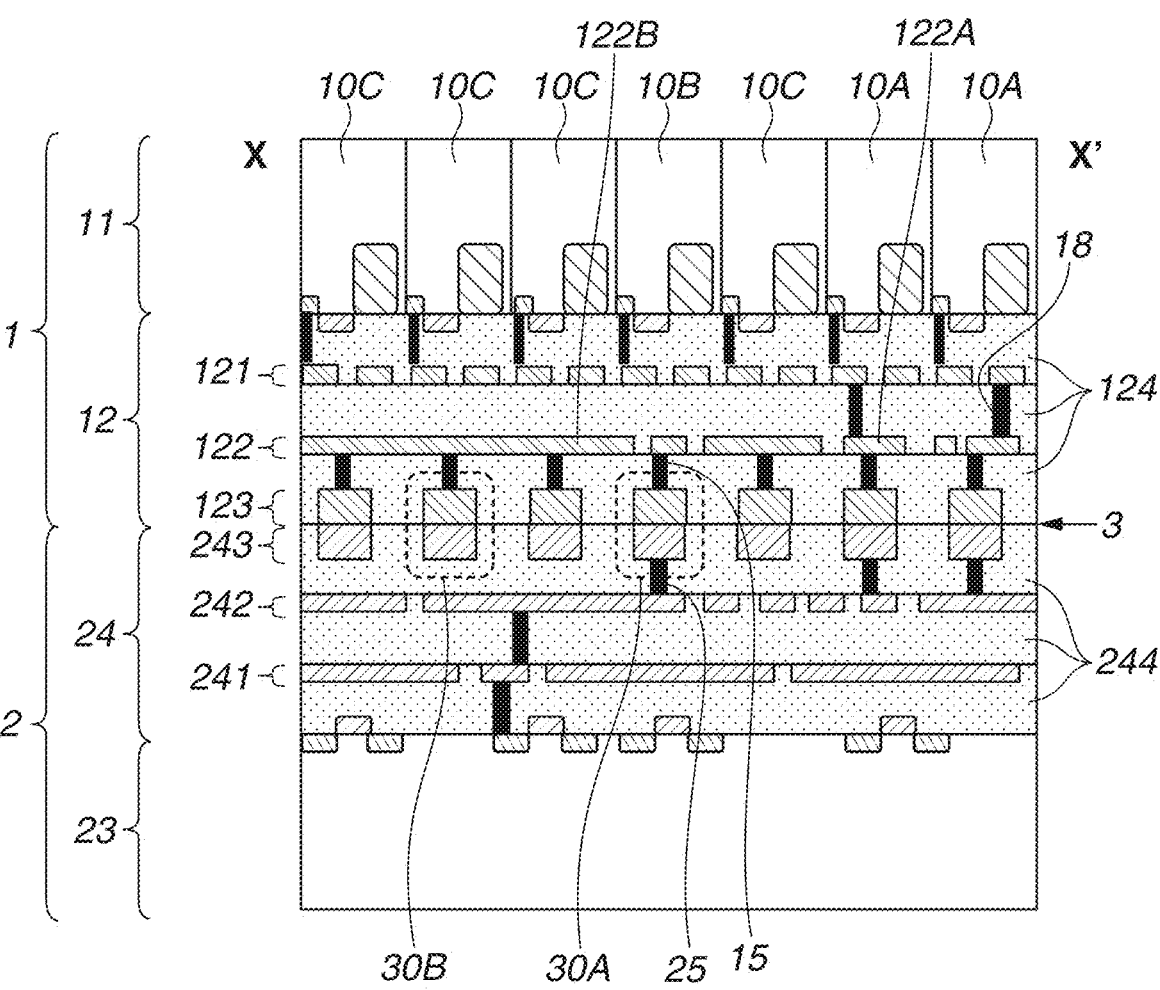
FIGS. 5C and 5D are diagrams illustrating schematic cross-sectional views according to the first embodiment.
Figure 5D:
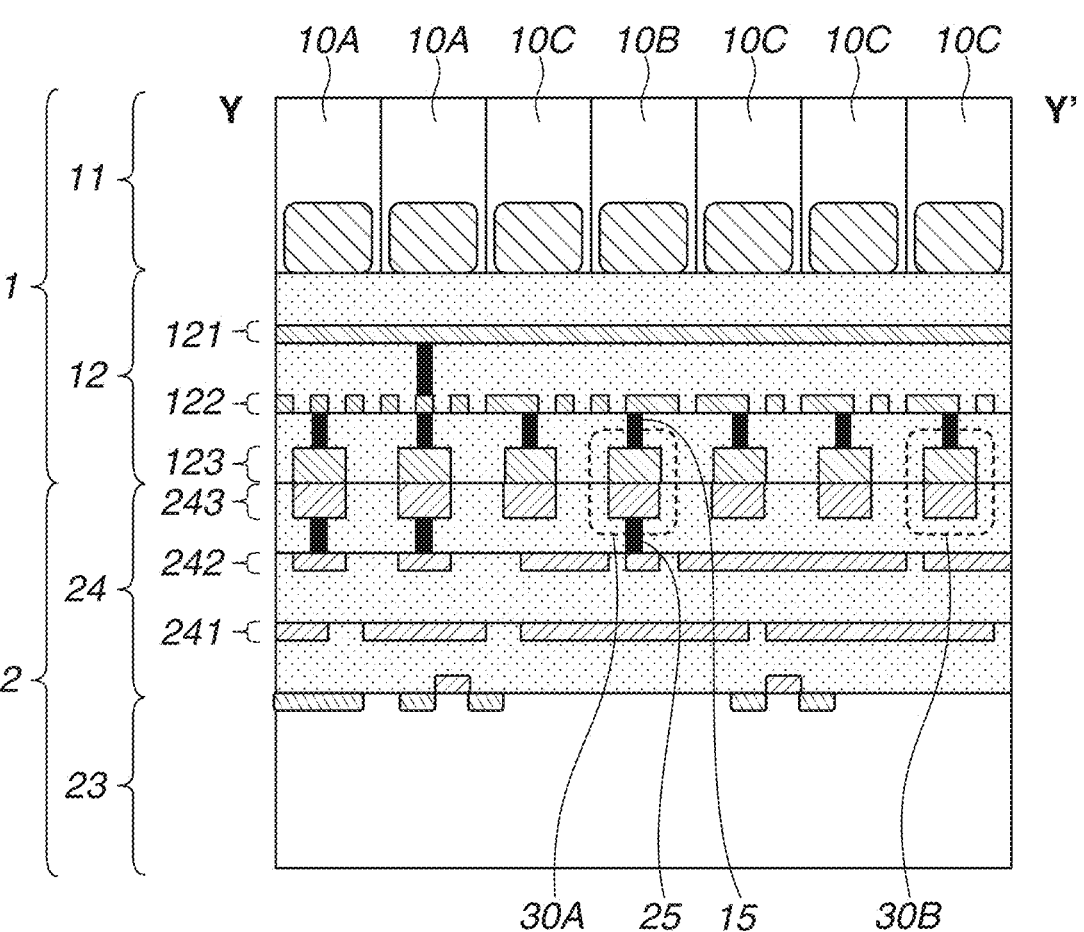

FIG. 5C is a cross-sectional view for the plan views illustrated in FIGS. 5A and 5B taken along the line X-X'. FIG. 5D is a cross-sectional view for the plan views illustrated in FIGS. 5A and 5B taken along the line Y-Y'. As illustrated in FIG. 5D, the pixels 10A and 10B include the metal bonding portions 30A, and the pixel 10C includes the metal bonding portion 30B. In FIG. 5C, the metal bonding portion 30A connects the semiconductor element layers 11 and 23. In FIG. 5C, as described above, the metal bonding portion 30B is not connected to the semiconductor element layer 23 in a region overlapping with the pixel region in a plan view. More specifically, the metal bonding portion 30B does not connect the semiconductor element layers 11 and 23 in a region overlapping with the pixel region in a plan view but is connected to the semiconductor element layer 11 via the wiring layer 122.

As illustrated in FIGS. 5A to 5D, at least two metal bonding portions 30B and the wiring pattern 122B in the wiring layer 122 are connected. According to the present embodiment, a wiring pattern refers to a wiring layer separated in a plan view. It is desirable that at least four metal bonding portions 30B are connected to the wiring pattern 122B. Connecting a plurality of the metal bonding portions 30B to one continuous wiring pattern 122B as described above enables securing a larger volume of the wiring pattern 122B than in a case where each of the metal bonding portions 30B is connected to a separated one of the wiring patterns. This configuration facilitates radiation of heat from the semiconductor element layer 11.

It is desirable that the area of the wiring pattern 122B is larger than the area of the wiring pattern 122A in a plan view. This configuration enables securing a waste heat path. For example, the areas of the wiring patterns 122A and 122B can be compared, for example, by comparing the wiring patterns corresponding to the pixels in five rows by five columns.

When a 1,000 μm by 1,000 μm region is viewed on the chip 1, it is desirable that the area of the wiring pattern 122B is at least 10 times the area of the wiring pattern 122A, and it is more desirable that the area of the wiring pattern 122B is at least 20 times the area of the wiring pattern 122A.

Figure 6:
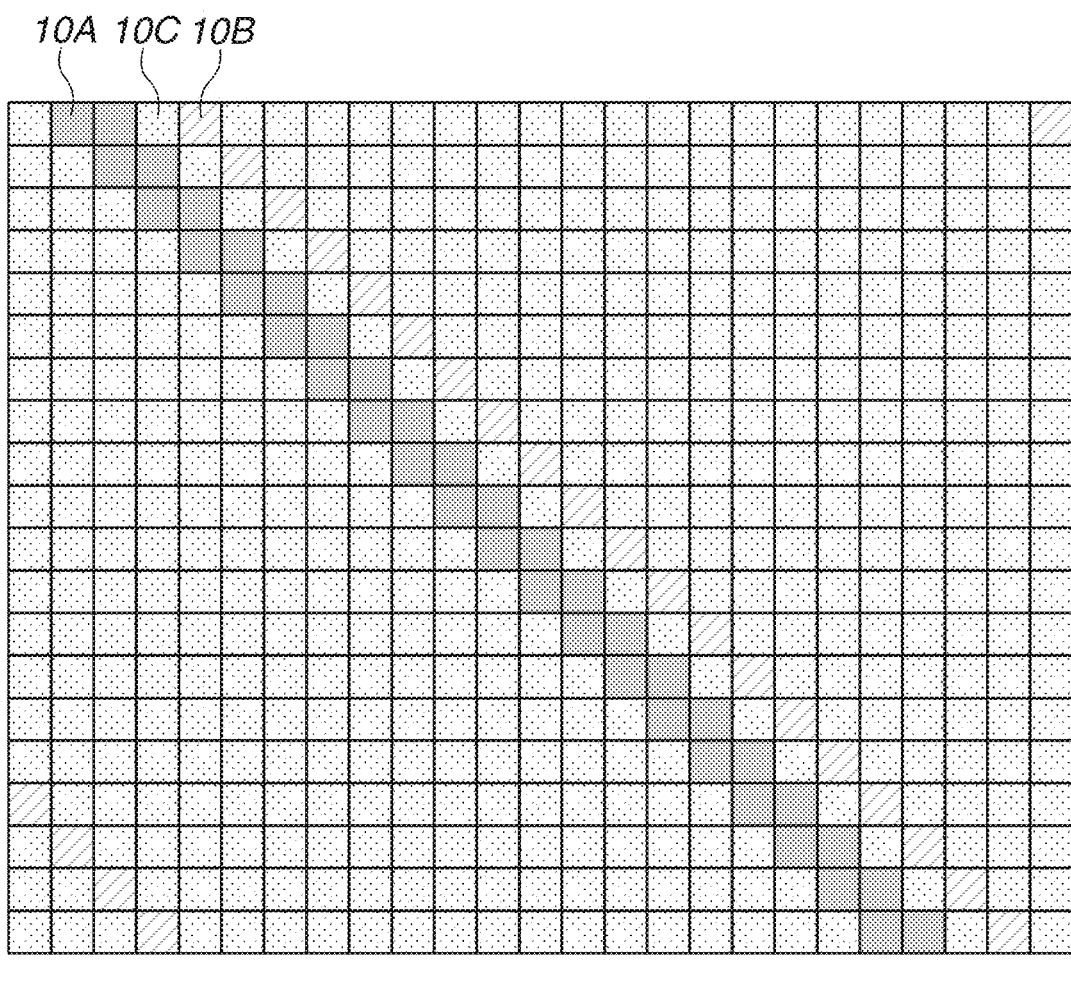
FIG. 6 is a diagram illustrating a pixel arrangement pattern according to the first embodiment.

FIG. 6 illustrates an example of an arrangement pattern of the pixels 10A, 10B, and 10C in a pixel region where pixels are arranged in 25 rows by 25 columns in the photoelectric conversion apparatus according to the present embodiment. In the pixel region, each row includes two pixels 10A including the metal bonding portion 30A, and each column includes one pixel 10B including the metal bonding portion 30A. Other pixels 10C include the metal bonding portion 30B.

Details will be described below. According to the present embodiment, as illustrated in FIG. 6, when at least either one of a row and a column is viewed, the pixels 10C other than the pixels 10A and 10B including the metal bonding portion 30A includes the metal bonding portion 30B. More specifically, the number of metal bonding portions 30B is larger than the number of metal bonding portions 30A. In the above-described configuration, the pixel region and metal bonding portions are not locally connected in the pixel region, and the number of regions where the pixel region and metal bonding portions are connected can be increased. Therefore, disposing the metal bonding portion 30B in this way enables reducing an uneven heat transfer to a further extent than in a case where the metal bonding portion 30B is not disposed.

As illustrated in FIG. 6, since the metal bonding portion 30A or 30B is disposed in each pixel 10, the distance between the metal bonding portions 30 can be maintained constant. This enables reducing an uneven heat transfer to a further extent. A plurality of the metal bonding portions 30 may be disposed in one pixel 10. The number of metal bonding portions 30 disposed may be different for each pixel 10. Meanwhile, the metal bonding portion 30 may not be disposed in some pixels 10. For example, the metal bonding portion 30B is disposed in only one of the pixels 10C illustrated in FIG. 6, and the metal bonding portion 30 is not disposed or the metal bonding portion 30C is disposed in other pixels 10C.

The effect of the present embodiment will be described below with reference to comparative examples illustrated in FIG. 7 and FIGS. 8A to 8C. The configurations of the comparative examples will be described below.

Figure 7:
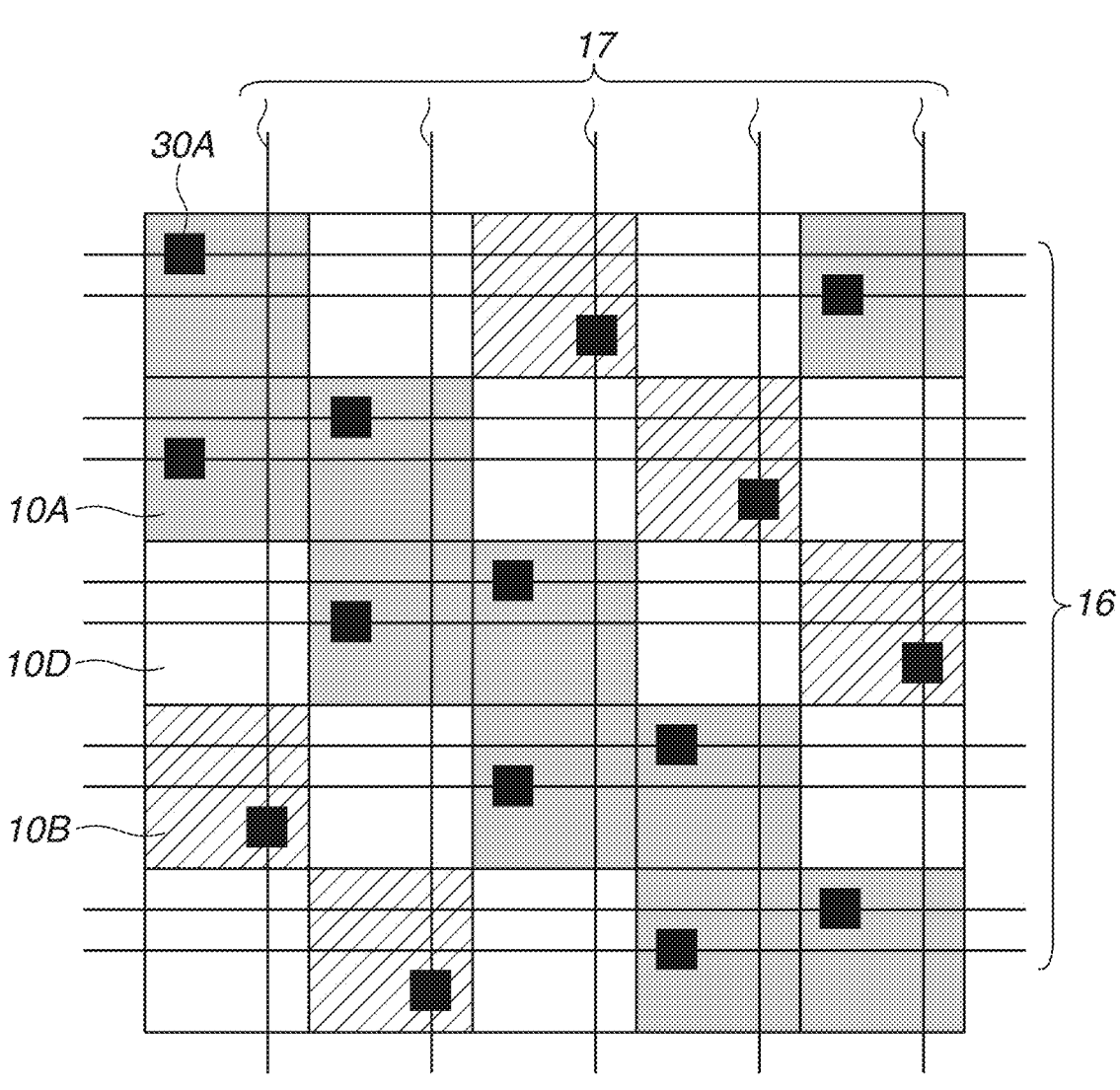
FIG. 7 is a plan view schematically illustrating arrangements of metal bonding portions according to a comparative example.
Figure 8A:
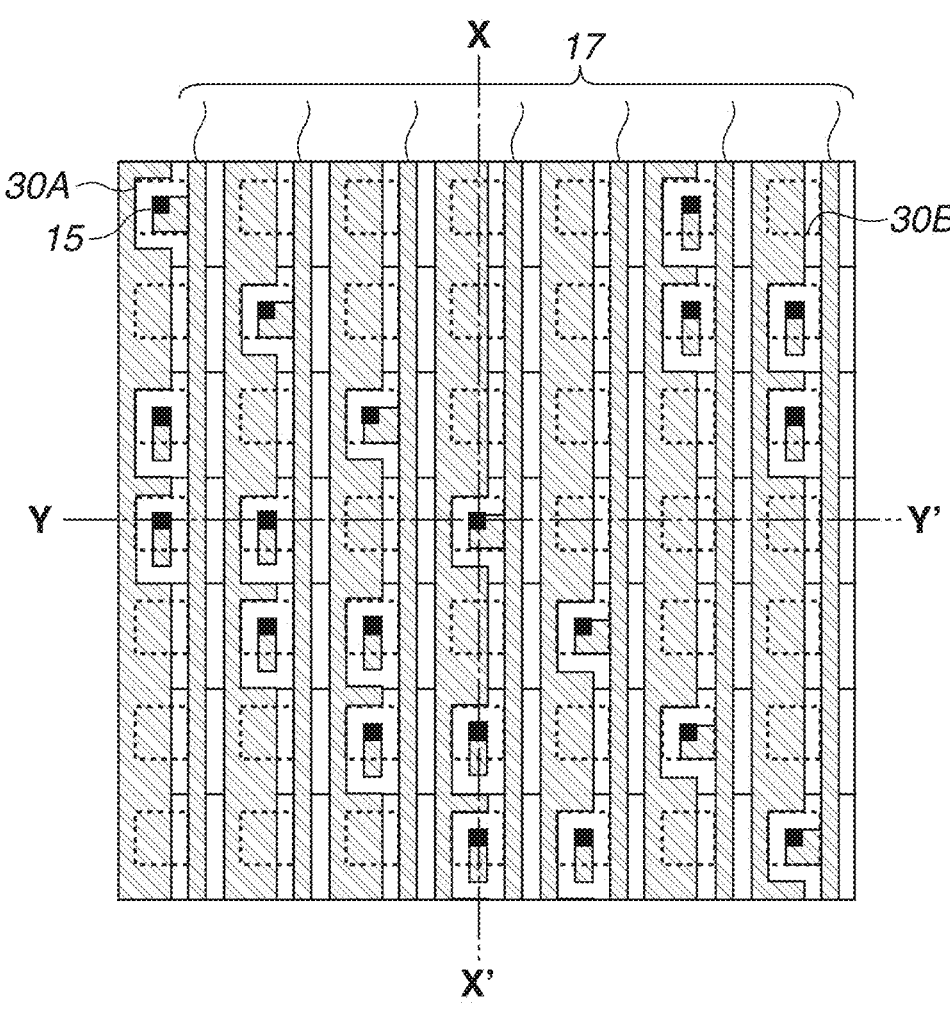
FIG. 8A is a diagram illustrating a schematic plan view.
Figure 8B:
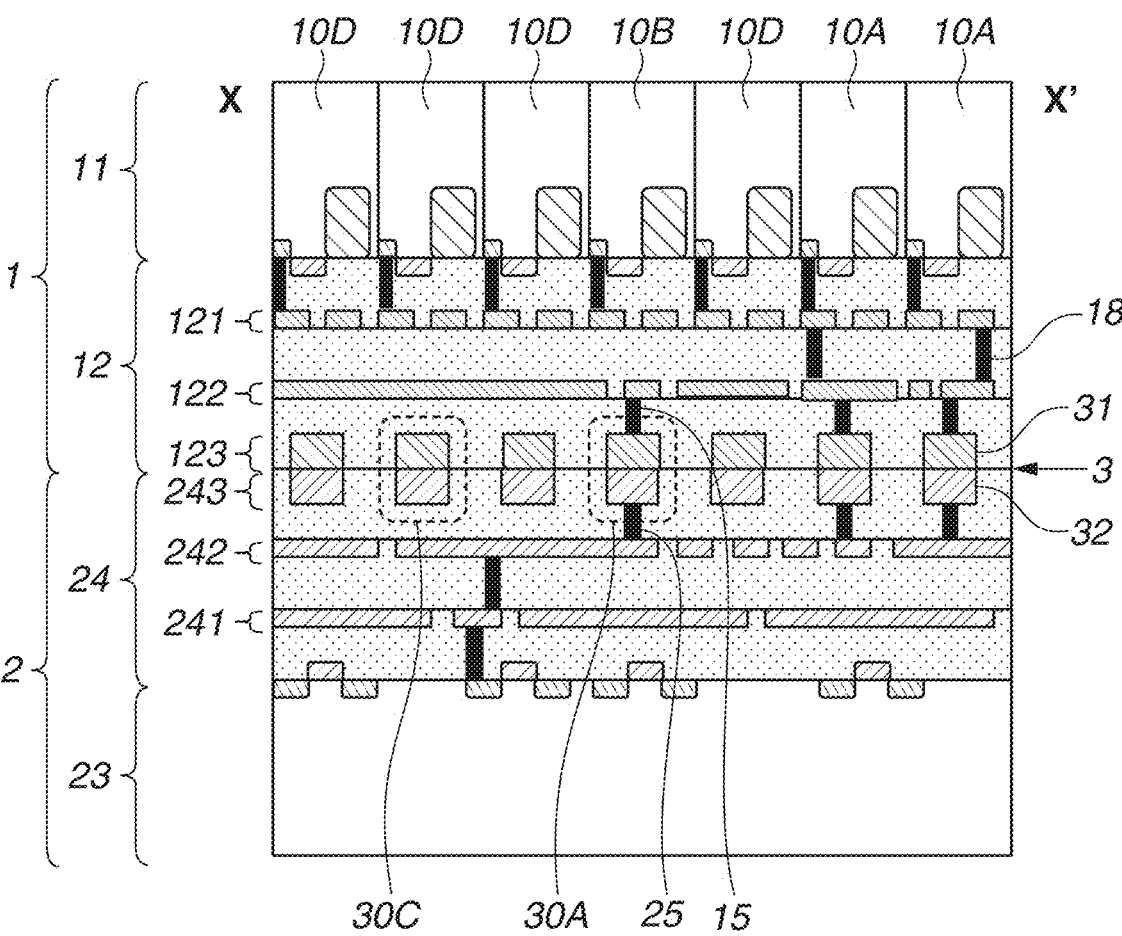
FIGS. 8B and 8C are diagrams illustrating schematic cross-sectional views according to the comparative example.
Figure 8C:
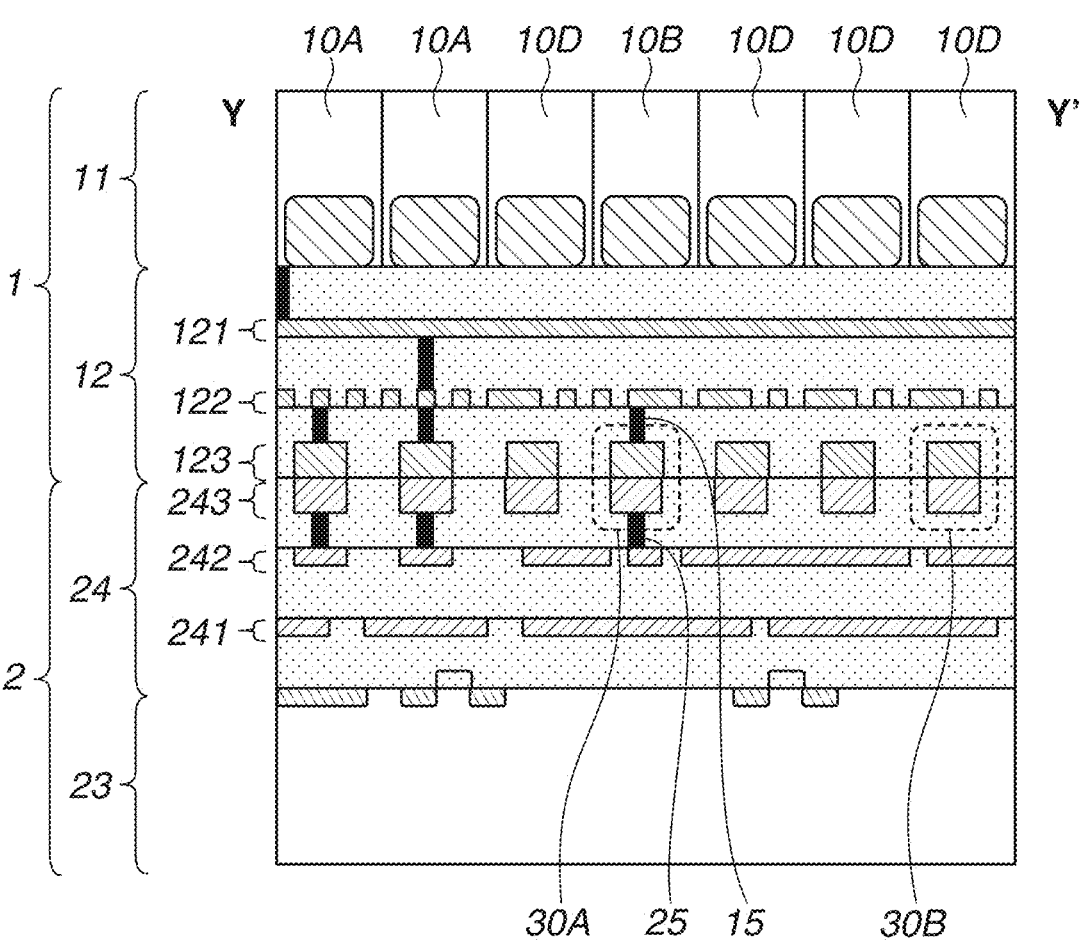

FIG. 7 is a plan view schematically illustrating an arrangement of the metal bonding portions according to a comparative example. The comparative example differs from the first embodiment in that the metal bonding portions 30B are not disposed. FIG. 8A is a plan view illustrating the wiring layer 122 according to the comparative example. In FIG. 8A, the metal bonding portion 30A is drawn with long broken lines, and the metal bonding portion 30C is drawn with long chain double-dashed lines. Although not illustrated, the wiring corresponding to the wiring layer 121 is the same as the wiring illustrated in FIG. 5B according to the first embodiment. FIG. 8B is a cross-sectional view taken along the line X-X' illustrated in FIG. 8A. FIG. 8C is a cross-sectional view taken along the line Y-Y' illustrated in FIG. 8A.

As illustrated in FIGS. 8A, 8B, and 8C, the metal bonding portions 30B are not disposed in the comparative example. More specifically, a plurality of the metal bonding portions 30 includes metal bonding portions 30A or metal bonding portions 30C connected to none of the semiconductor element layers 11 and 23.

Figure 14B:
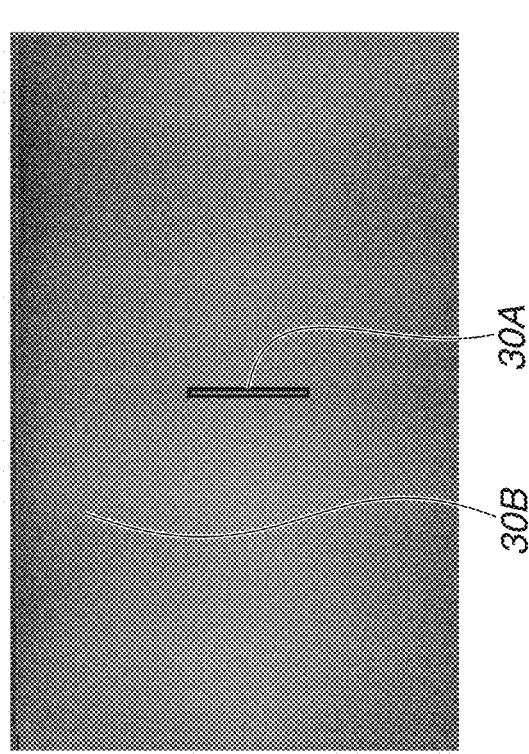
FIGS. 14A and 14B are diagrams illustrating comparative photographs captured under dark conditions.
Figure 14A:
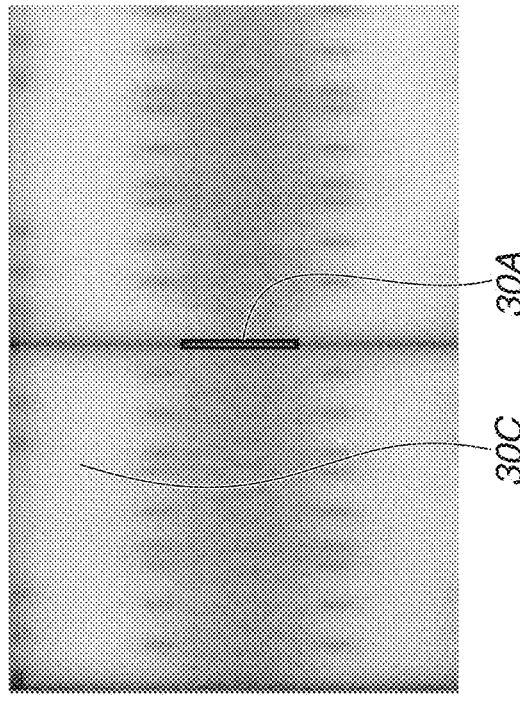

FIG. 14A illustrates an image captured under a dark condition by the photoelectric conversion apparatus according to the comparative example, and 14B illustrates an image captured under a dark condition by the photoelectric conversion apparatus according to the first embodiment under the same condition. In FIGS. 14A and 14B, the color changes depending on the output, i.e., the image becomes more blackish with a smaller output and more whitish with a larger output.

Referring to FIG. 14A, the image becomes black in the vicinity of the region of pixels electrically connected via the metal bonding portion 30A. Meanwhile, the image becomes white in the vicinity of the region of pixels including the metal bonding portion 30C not connected to the wiring layer 122. In the comparative example, an uneven output arises for each pixel in this way. In FIG. 14B, in contrast, the image is totally blackish. This means that an uneven output for each pixel is reduced. Thus, in the first embodiment, an uneven output is reduced to a further extent than in the comparative example.

The following describes an assumption of the occurrence mechanism of an uneven output according to the comparative example, and an assumption of the occurrence mechanism of the reduction of an uneven output according to the present embodiment. The mechanism described below is an assumption by the inventors, but does not limit the effect of the present invention to this mechanism.

The thermal conductivity of a copper wiring as a general wiring layer is about 400 to 410 [W/mK], while the thermal conductivity of a silicon oxide as a general interlayer insulation material is 5 to 15 [W/mK]. The heat generated in the vicinity of the pixels 10A and 10B is radiated to the circumference via the wiring layers and the metal bonding portion 30A. More specifically, the pixels 10A and 10B can radiate heat not only in the wiring layers 121 and 122 but also in the wiring layers 123 and 243. Thus, the heat generated in the vicinity of the photoelectric conversion elements of the pixels 10A and 10B is radiated to a further extent than the heat generated in the vicinity of the photoelectric conversion element of a pixel 10D. Meanwhile, the pixel 10D includes no metal bonding portion connected to the semiconductor element layer 11. More specifically, the heat generated in the vicinity of the photoelectric conversion element of the pixel 10D can be radiated only in the wiring layers 121 and 122 connected to the pixels 10. Consequently, the photoelectric conversion elements of the pixels 10A and 10B having larger heat radiation provides a smaller dark current than the pixel 10D having smaller heat radiation. Thus, it is assumed that an uneven output arises from an uneven dark current due to heat.

Meanwhile, according to the present embodiment, the metal bonding portion 30B and the wiring layer 122 are electrically connected, as illustrated in FIGS. 5A to 5D. More specifically, the pixel 10C can radiate heat not only in the wiring layers 121 and 122 but also in the wiring layers 123 and 243 (metal bonding portion 30B). Consequently, a dark current can be reduced to a further extent in pixels other than the pixels 10A and 10B than in the comparative example. Therefore, the pixels 10A, 10B, and 10C provide the same degree of heat radiation, an uneven output due to a dark current in an image captured under a dark condition can be reduced.

According to the comparative example, as described above, only the metal bonding portion 30A serves as a waste heat path, and a local temperature drop occurs. Meanwhile, the present embodiment makes it possible to increase the number of waste heat paths for heat generated in the photoelectric conversion element, in the pixel region. Therefore, heat can be radiated uniformly and an uneven dark current can be reduced or removed.

The effect of increasing the number of waste heat paths can be obtained even in a case where only one metal bonding portion 30B is provided. In a case where one metal bonding portion 30B is provided, for example, the power source wiring and the metal bonding portion 30B can be connected with each other. There are diverse variations of the configuration of the metal bonding portion 30B in which, for example, one metal bonding portion 30B is disposed for each pixel region with m by n pixels, and one metal bonding portion 30B is disposed for each column. In either case, the effect of increasing the number of waste heat paths can be obtained.

Although, in the present embodiment, all of the metal bonding portions 30 include metal bonding portions 30A or 30B, the present invention is not limited thereto. For example, the metal bonding portions 30B may be discretely disposed. As an example of such a configuration, the metal bonding portion 30C is disposed between the metal bonding portions 30B. Even in this case, an uneven dark current will be reduced to a further extent than in the case illustrated in FIG. 14A. For example, a configuration in which the metal bonding portions 30C are disposed between the metal bonding portions 30B is also included in the present invention. Even in a case where the metal bonding portion 30C is disposed between the metal bonding portions 30B, an uneven dark current can be reduced to a further extent than in the comparative example. In this case, it is preferable that the metal bonding portions 30B are disposed at predetermined intervals. This enables reducing an uneven dark current to a further extent.

It is desirable that the wiring patterns in the wiring layers 123 and 243 are bonded with each other through direct contact. To ensure the bonding strength, it is desirable that the interlayer insulation material 124 in the wiring layer 123 is also bonded with the interlayer insulation material 244 in the wiring layer 243.

As described above, the configuration according to the first embodiment makes it possible to reduce an uneven output due to a dark current to a further extent than in the comparative example.

Second Embodiment

The photoelectric conversion apparatus according to a second embodiment will be described below with reference to FIGS. 9A to 9C. The photoelectric conversion apparatus according to the second embodiment differs from the photoelectric conversion apparatus according to the first embodiment in the wiring layer 125 disposed between the wiring layers 121 and 122 and a wiring pattern in the wiring layer 122. Since configurations other than the following configurations are similar to those according to the first embodiment, redundant descriptions thereof will be omitted. The photoelectric conversion apparatus according to the second embodiment includes all of the configurations illustrated in FIGS. 1 to 3.

Figure 9A:
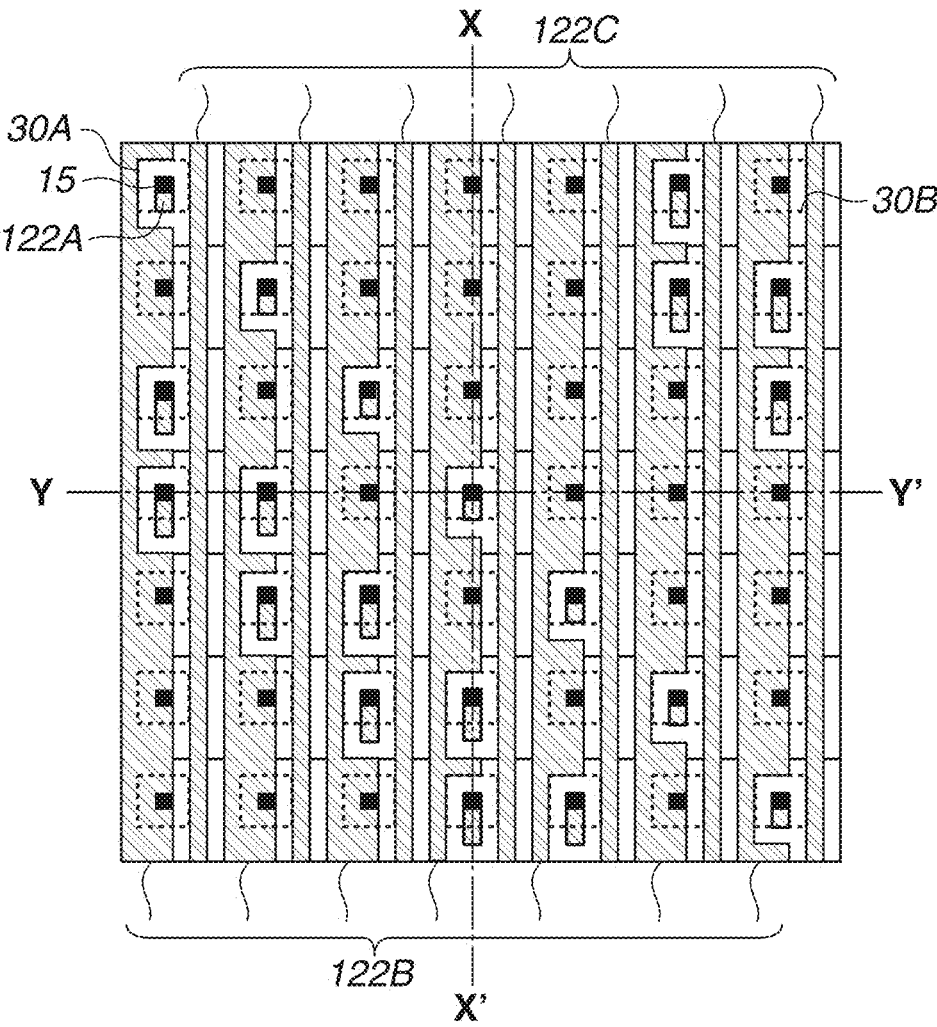
FIG. 9A is a diagram illustrating a schematic plan view.
Figure 9B:
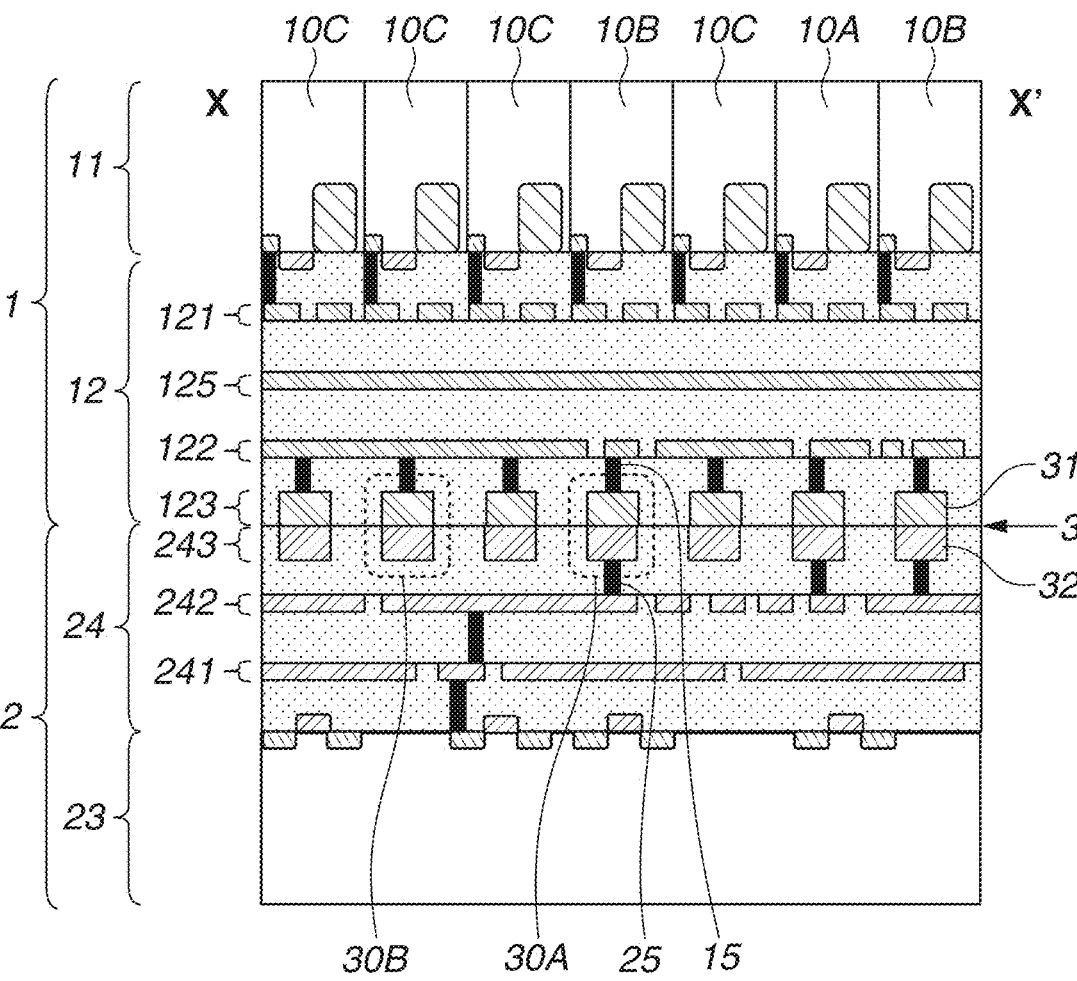
FIGS. 9B and 9C are diagrams illustrating schematic cross-sectional views according to a second embodiment.
Figure 9C:
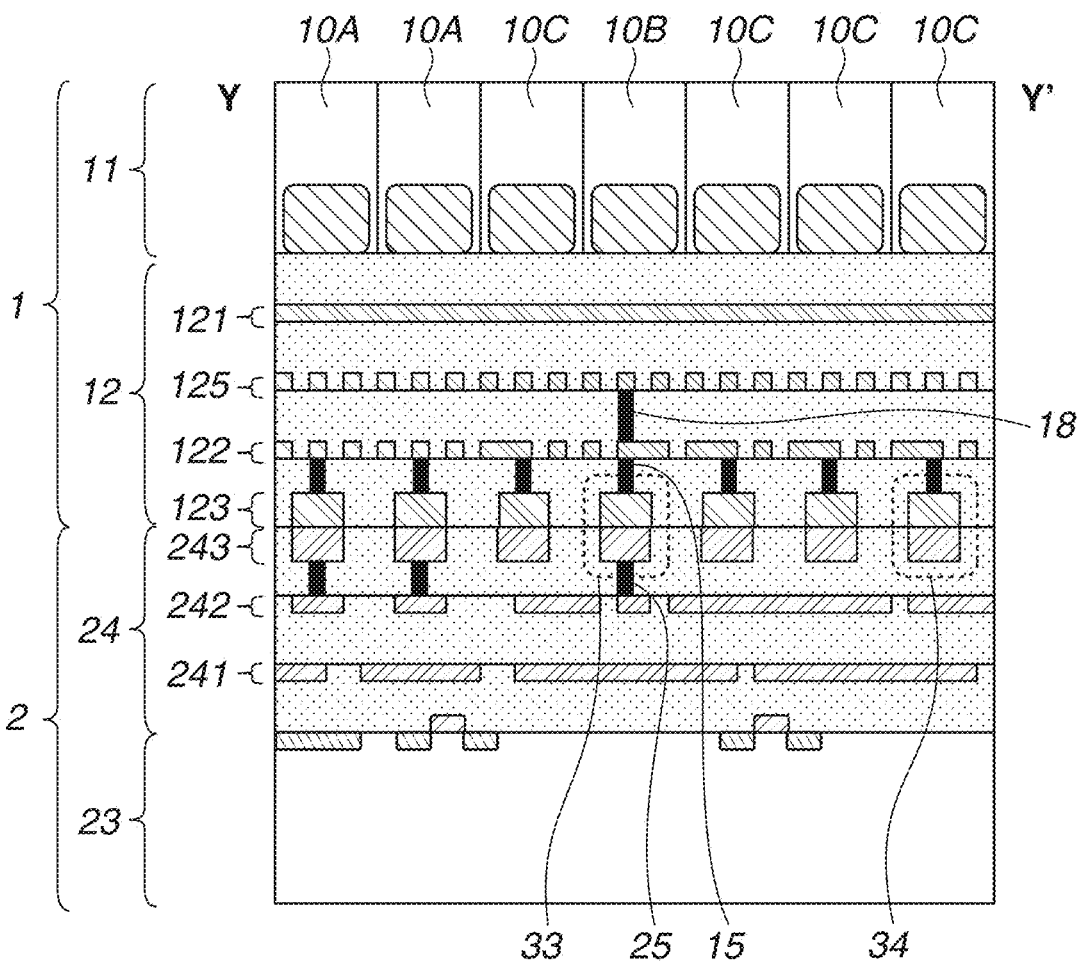

FIG. 9A is a plan view illustrating the wiring layer 122 of the photoelectric conversion apparatus according to the second embodiment. FIG. 9B is a cross-sectional view taken along the line X-X' illustrated in FIG. 9A. FIG. 9C is a cross-sectional view taken along the line Y-Y' illustrated in FIG. 9A.

FIG. 9A illustrates the wiring patterns 122A, 122B, and 122C, the metal bonding portions 30A and 30B, and the via plugs 15. The wiring patterns 122B and 122C are VDD wirings supplied with the power voltage or GND wirings supplied with the ground voltage. According to the present embodiment, the vertical output lines 17 are not disposed in the wiring layer 122. The wiring layer 125 is disposed between the wiring layers 121 and 122. The vertical output lines 17 are included in the wiring layer 125. Thus, the vertical output lines 17 are not limited by the arrangement of the wiring patterns 122B and 122C in a plan view. Thus, a plurality of the vertical output lines 17 can be disposed in the pixels 10. This enables reading signals from the plurality of the vertical output lines 17 at the same time by using the signal processing circuit 22, whereby the reading speed can be improved.

The wiring patterns 122B and 122C are power source wirings or GND wirings, and therefore can be arranged with thicker wirings than the output lines without the limitation of the wiring capacitance. This increases the areas of the wiring patterns 122B and 122C, and thus the wiring patterns 122B and 122C can be easily connected with the plurality of the metal bonding portions 30B. Heat radiation in the metal bonding portion 30B increases to the same degree of heat radiation as that in the metal bonding portion 30A, whereby an uneven output due to a dark current can be reduced.

The areas of the wiring patterns 122B and 122C connected with the metal bonding portion 30B via the via plugs 15 in a plan view are larger than the area of the wiring pattern 122A connected with the metal bonding portion 30A via the via plugs 15 in a plan view. At least two metal bonding portions 30B are connected to the wiring patterns 122B and 122C.

Third Embodiment

The photoelectric conversion apparatus according to a third embodiment will be described below with reference to FIGS. 10A to 10C. The photoelectric conversion apparatus according to the third embodiment differs from the photoelectric conversion apparatuses according the first and the second embodiments in that the electrical circuits of the chip 2 and the metal bonding portions 30B are connected and that the metal bonding portions 30B and the semiconductor element layer 11 of the chip 1 are not connected. Since configurations other than the following configurations are similar to those according to the first and the second embodiments, redundant descriptions thereof will be omitted. The photoelectric conversion apparatus according to third embodiment includes all of the configurations illustrated in FIGS. 1 to 3.

Figure 10A:
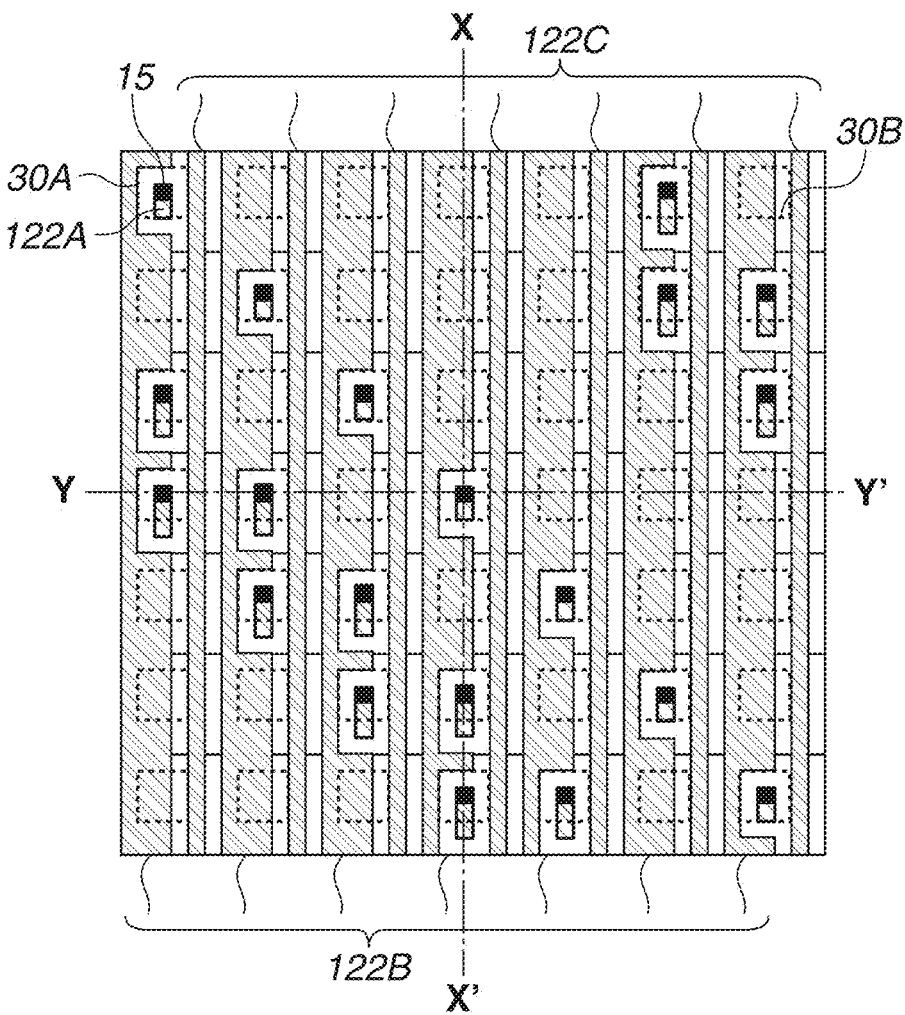
FIG. 10A is a diagram illustrating a schematic plan view.
Figure 10B:
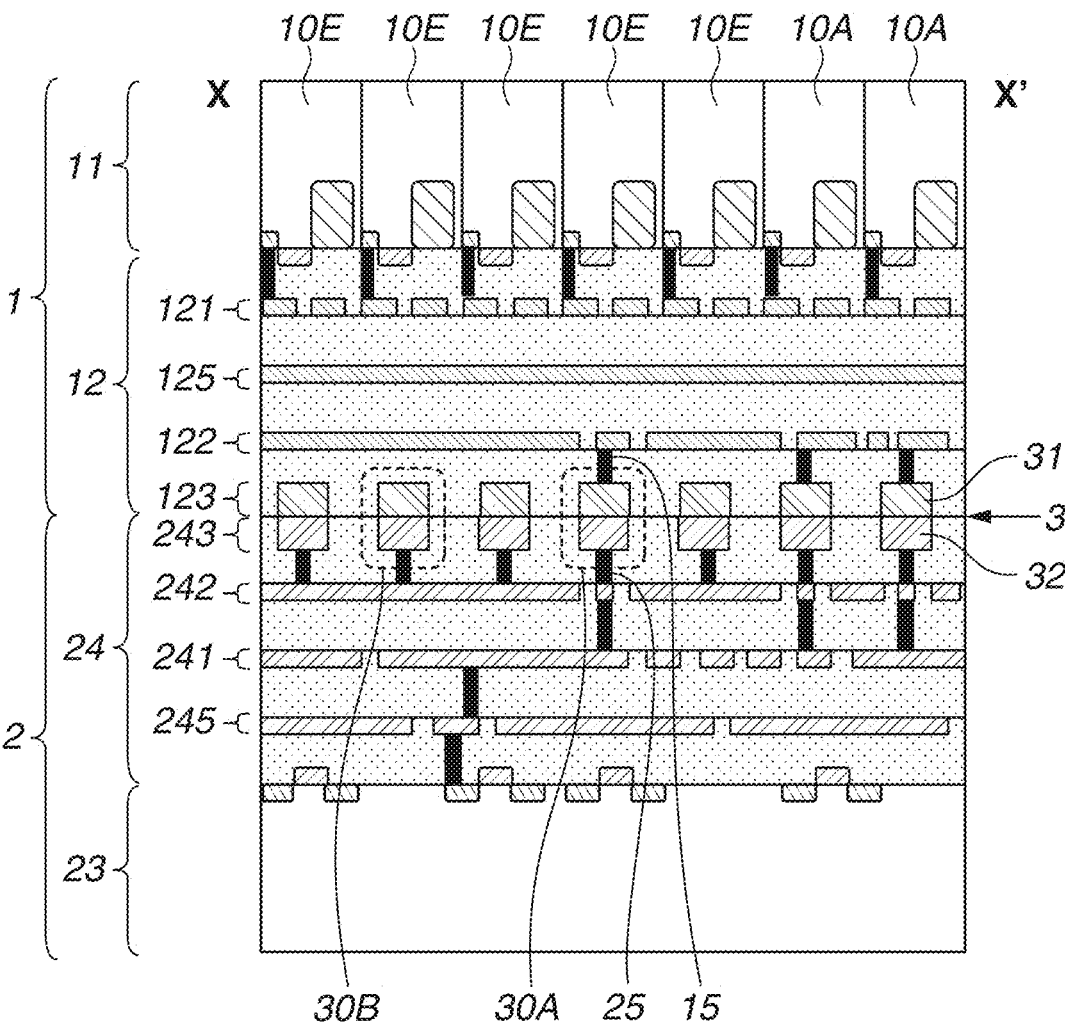
FIGS. 10B and 10C are diagrams illustrating schematic cross-sectional views according to a third embodiment.
Figure 10C:
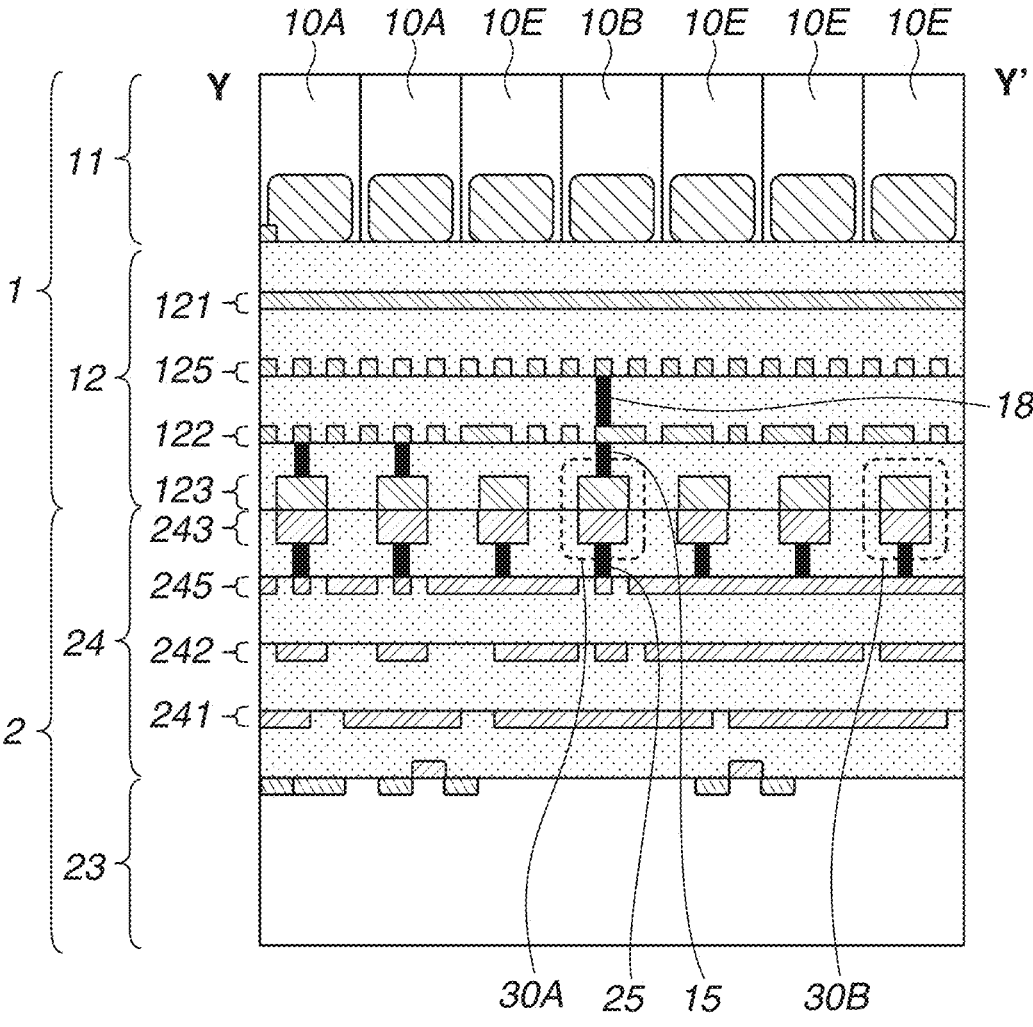

FIG. 10A is a plan view illustrating the wiring layer 122 of the chip 1 according to the third embodiment. FIG. 10B is a cross-sectional view taken along the line X-X' illustrated in FIG. 10A. FIG. 10C is a cross-sectional view taken along the line Y-Y' illustrated in FIG. 10A.

FIG. 10A illustrates the wiring patterns 122A, 122B, and 122C, the metal bonding portion 30B, and the via plugs 15. The third embodiment differs from the second embodiment in that the wiring patterns 122B and 122C as power source wirings or GND wirings are not continuous to the metal bonding portion 30B and that the wiring layer 245 is disposed between the wiring layers 242 and 243. According to the third embodiment, there is disposed a pixel 10E where the bonding portions 30B and the wiring layer 245 are connected via the via plug 25. At least two metal bonding portions 30B are connected to the wiring pattern in the wiring layer 245.

According to the third embodiment, the metal bonding portion 30B disposed in the pixel 10E is connected to the wiring layer 245 via the via plug 25. More specifically, heat generated in the chip 2 where the pixel 10E is disposed can be radiated not only in the connected wiring layers 241, 242, and 245 but also in the wiring layers 243 and 123, like the pixels 10A and 10B. Thus, since the pixel 10E can also radiate heat, an uneven heat transfer hardly occurs. This makes equal the degree of heat radiation in the pixels 10A and 10E, whereby an uneven dark current in an image captured under a dark condition can be reduced.

According to the present embodiment, an uneven heat transfer can be reduced in a case where electrical circuits easy to generate heat are disposed in the semiconductor element layer 23.

Fourth Embodiment

The photoelectric conversion apparatus according to a fourth embodiment differs from the photoelectric conversion apparatus according to the first embodiment in that the metal bonding portions 30B are connected but are not electrically connected with the semiconductor element layer 23. Since configurations other than the following configurations are similar to those according to the first embodiment, redundant descriptions thereof will be omitted. The photoelectric conversion apparatus according to the fourth embodiment includes all of the configurations illustrated in FIGS. 1 to 3.

Figure 11:
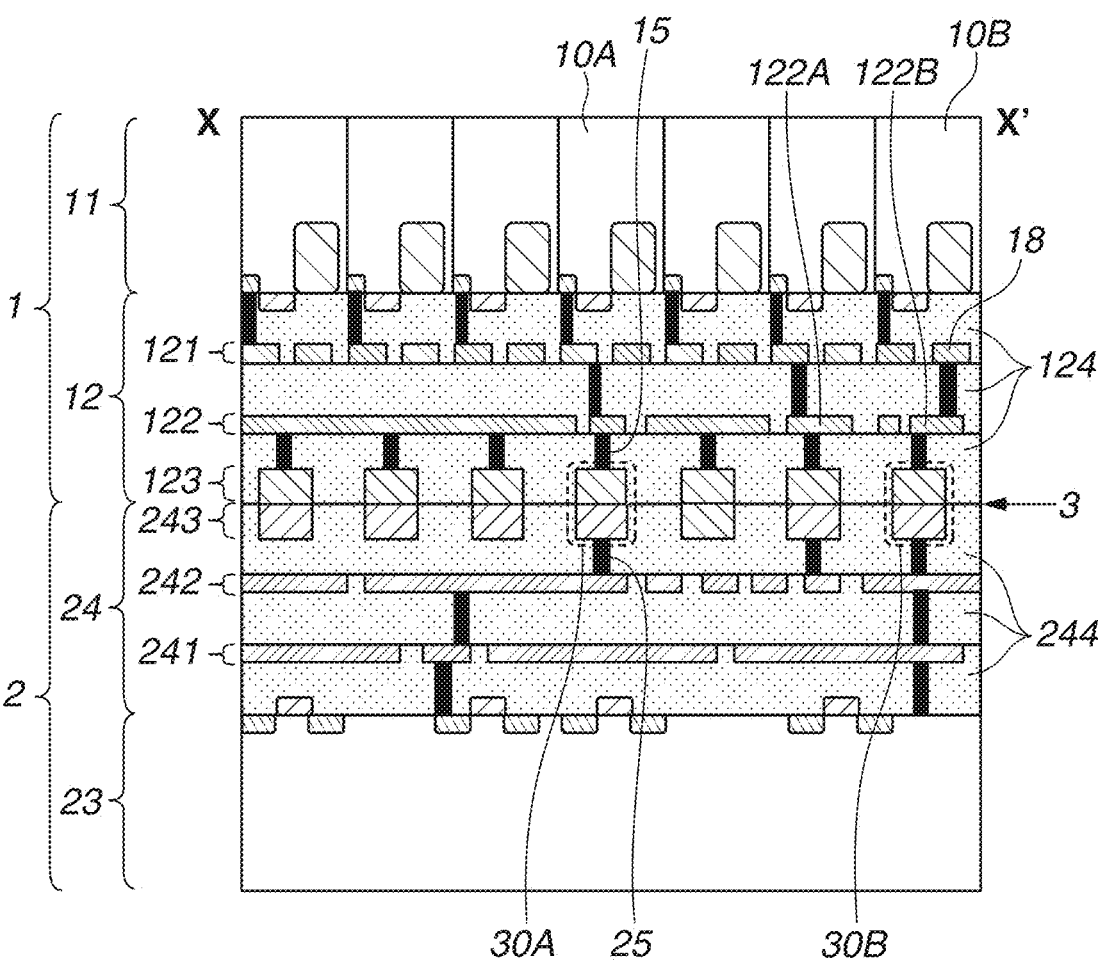
FIG. 11 is a diagram illustrating a schematic cross-sectional view according to a fourth embodiment.

FIG. 11 is a cross-sectional view illustrating the photoelectric conversion apparatus according to the fourth embodiment.

As illustrated in FIG. 11, the metal bonding portion 30B according to the present embodiment is connected to the pixel circuit of the semiconductor element layer 11 and to the semiconductor element layer 23 but is not connected to the signal processing circuit of the semiconductor element layer 23. This means that the signal passing through the metal bonding portion 30B is not output as a signal from a pixel.

More specifically, according to the present embodiment, the metal bonding portion 30B is not connected to the signal processing circuit of the semiconductor element layer 23. At least four metal bonding portions 30B are connected to one metal layer.

It is desirable that the bonding portion between the metal bonding portion 30B and the semiconductor element layer 23 is disposed away from the electrical circuit so that signals from pixels do not pick up noise.

Like the first embodiment, the present embodiment makes it possible to radiate heat generated in the pixel circuit to the metal bonding portion 30B, whereby an uneven heat transfer can be reduced. The present embodiment further makes it possible to release heat from the metal bonding portion 30B to the semiconductor element layer 23, and thus an uneven heat transfer can be reduced to a further extent.

Fifth Embodiment

The photoelectric conversion apparatus according to a fifth embodiment differs from the photoelectric conversion apparatus according to the first embodiment in that the metal bonding portions 30B is connected to the same wiring pattern as the wiring pattern connected to the metal bonding portions 30A but is not electrically connected to the signal processing circuit of the semiconductor element layer 23. Since configurations other than the following configurations are similar to those according to the first embodiment, redundant descriptions thereof will be omitted. The photoelectric conversion apparatus according to the fifth embodiment includes all of the configurations illustrated in FIGS. 1 to 3.

Figure 12B:
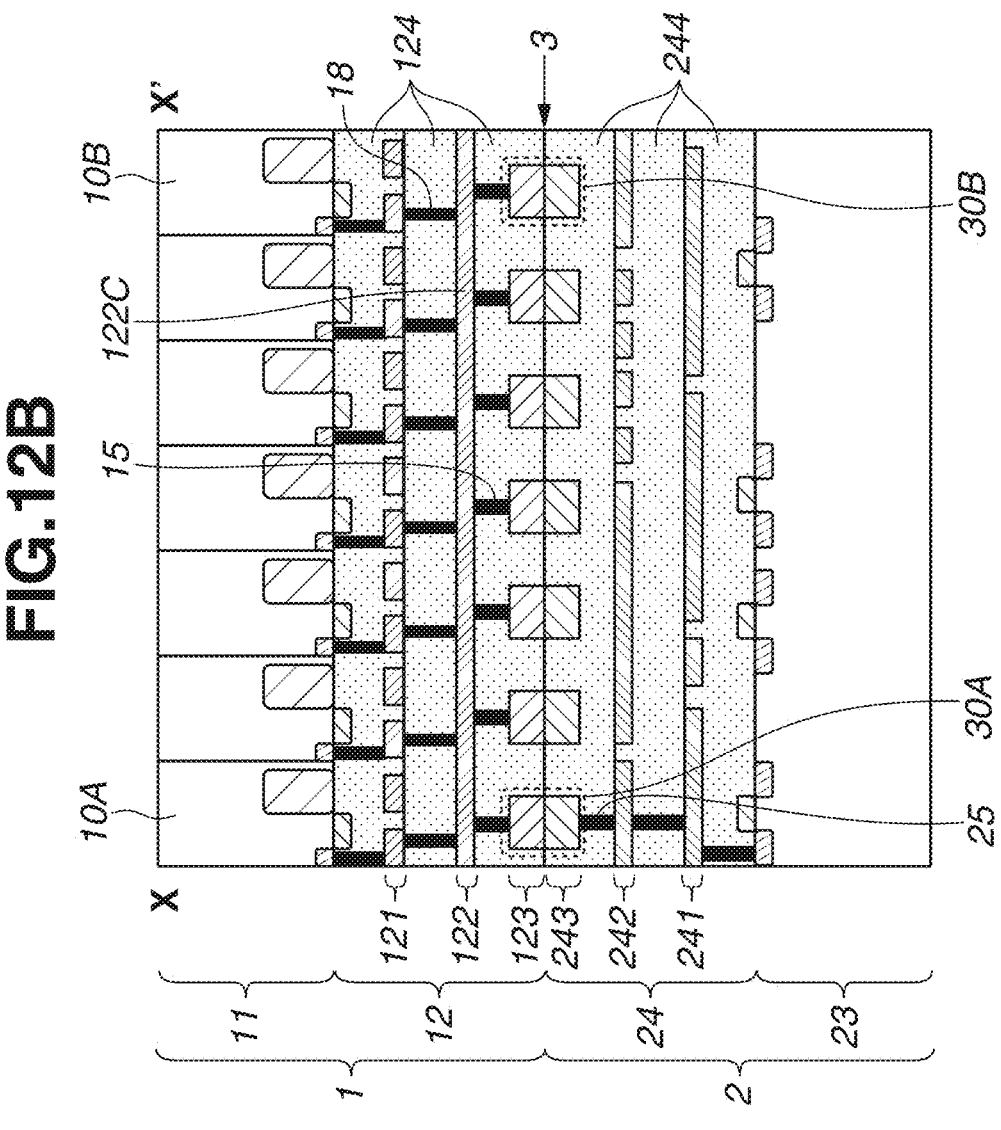
FIG. 12B is a diagram illustrating a schematic cross-sectional view according to a fifth embodiment.
Figure 12A:
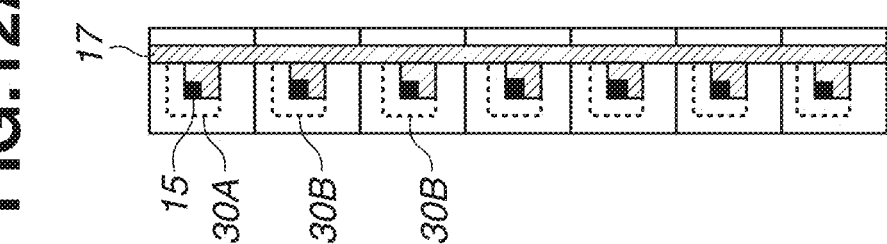
FIG. 12A is a diagram illustrating a schematic plan view.

FIGS. 12A and 12B are a plan view and a cross-sectional view, respectively, schematically illustrating the arrangement positions of the metal bonding portions 30A and 30B in the photoelectric conversion apparatus according to the fifth embodiment. The metal bonding portion 30A connects the semiconductor element layers 11 and 23. The metal bonding portion 30B is connected to the semiconductor element layer 11 but is not connected to the semiconductor element layer 23 in a position overlapping with the pixel region in a plan view.

The metal bonding portion 30B is connected to the same wiring pattern of the metal bonding portion 30A, i.e., the wiring pattern 122C. The wiring pattern 122C is, for example, is wiring for supplying a fixed potential. The wiring pattern 123C is, for example, is a wiring connected to the source or drain of the reset transistor.

The surface of the metal bonding portion 30B on the side of the semiconductor element layer 23 is in contact with the insulating material. More specifically, the metal bonding portion 30B is not electrically connected with the wiring pattern disposed in the wiring structure 24.

Like the first embodiment, the present embodiment makes it possible to reduce an uneven waste heat to a further extent than in a case where the metal bonding portion 30B is not disposed, i.e., the metal bonding portion 30B and the wiring layer are not connected.

(Modifications)

Figure 13:
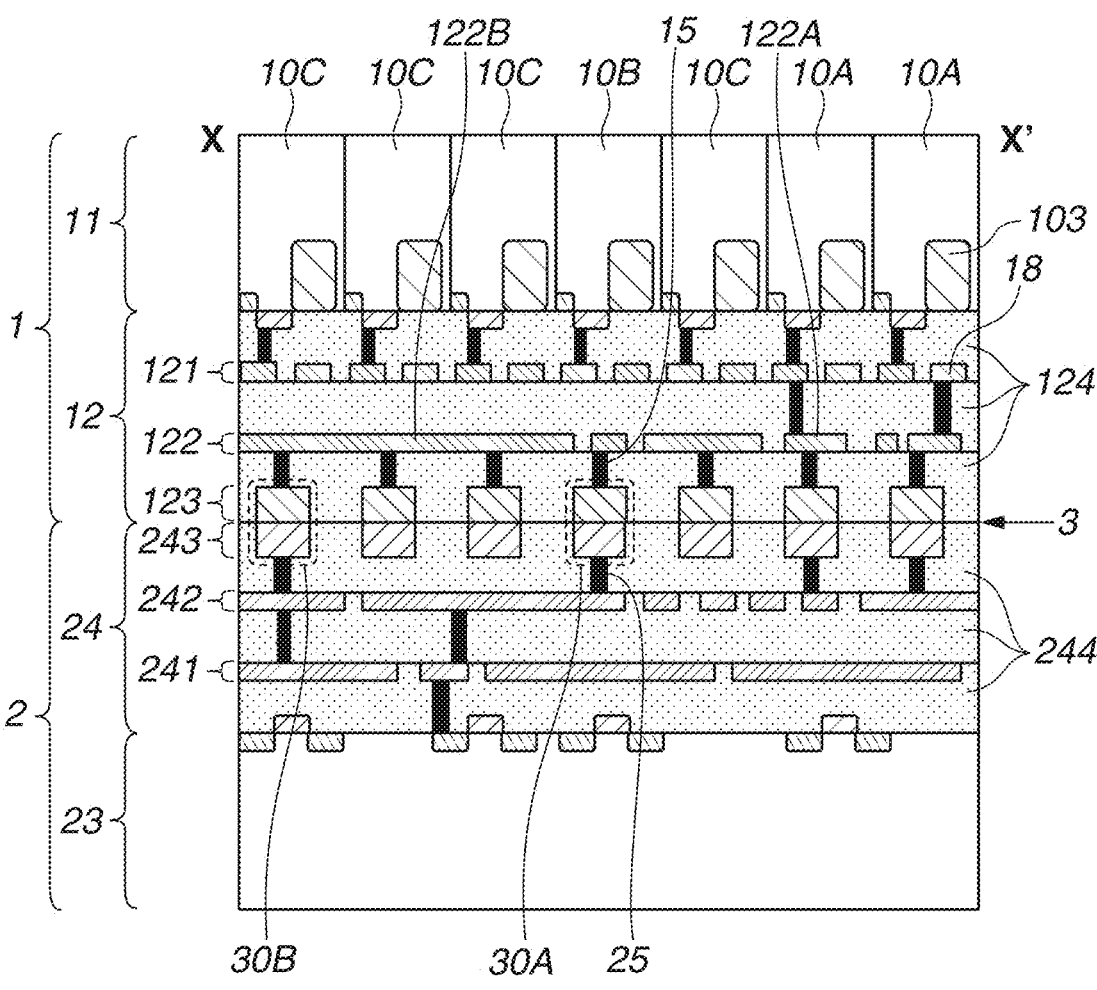
FIG. 13 is a diagram illustrating a schematic cross-sectional view according to a modification.

According to the first to the fifth embodiments, the metal bonding portion 30B is connected to either one of the wiring layers disposed above and below the metal bonding portion 30B, but is not connected to the other thereof. The present invention is not limited thereto. As illustrated in FIG. 13, the metal bonding portion 30B may be connected to both wiring layers disposed above and below the metal bonding portion 30B. More specifically, it is necessary that the metal bonding portion 30B is not electrically connected to the semiconductor element layer 11 or 23 in the pixel region, and may be continuous to the wiring layers 122 and 241 via plugs. Although, in this case, the number of processes for forming via plugs increases, the area of wiring can be increased, and thus a dark current can be reduced to a further extent.

Sixth Embodiment

Figure 15:
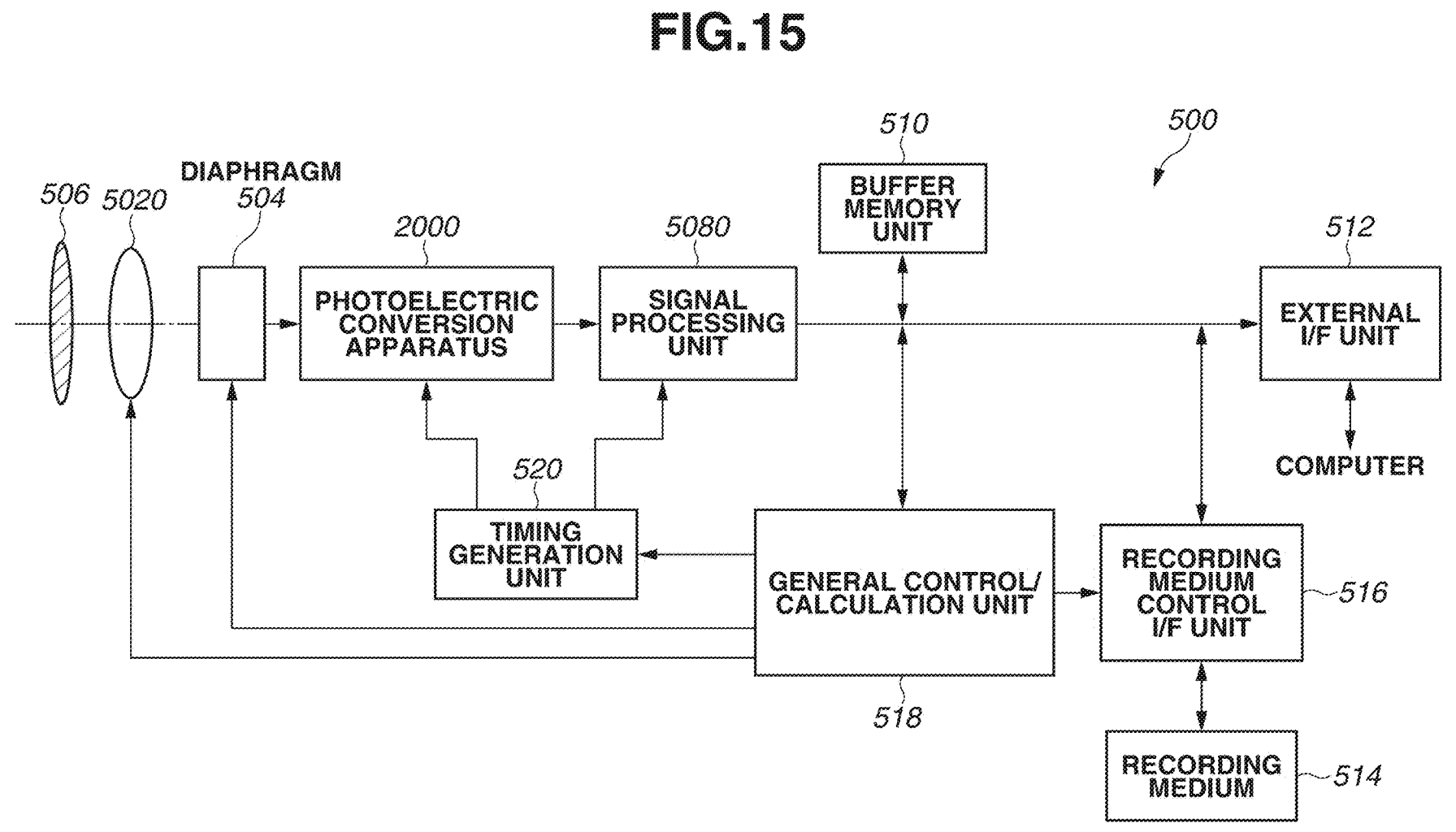

FIG. 15 is a block diagram illustrating a configuration of a photoelectric conversion system 500 according to a sixth embodiment. The photoelectric conversion system 500 according to the sixth embodiment includes a photoelectric conversion apparatus 2000 employing either one of the above-described configurations of the photoelectric conversion apparatus. FIG. 15 illustrates an imaging system as the photoelectric conversion system 500. Specific examples of imaging systems include digital still cameras, digital camcorders, and monitoring cameras. The photoelectric conversion system 500 includes a photoelectric conversion apparatus 2000, a lens 5020, a diaphragm 504, and a barrier 506 for protecting the lens 5020. The photoelectric conversion system 500 includes a signal processing unit 5080 (image signal generation unit) for processing the output signal from the photoelectric conversion apparatus 2000. The signal processing unit 5080 performs signal processing operations in which various types of corrections and compression as required are performed on the input signal and the signal is output. The signal processing unit 5080 may have a function of performing analog-to-digital (AD) conversion processing on the output signal from the photoelectric conversion apparatus 2000. The photoelectric conversion system 500 further includes a buffer memory unit 510 for temporarily storing image data, and an external interface (I/F) unit 512 for communicating with an external computer. The photoelectric conversion system 500 further includes a recording medium 514, such as a semiconductor memory for recording and reading imaging data, and a recording medium control I/F unit 516 for recording and reading data to/from the recording medium 514.

The photoelectric conversion system 500 further includes a general control/calculation unit 518 for performing various calculations and controlling the entire digital still camera, and a timing generation unit 520 for outputting various timing signals to the photoelectric conversion apparatus 2000 and the signal processing unit 5080. The photoelectric conversion apparatus 2000 outputs an image signal to the signal processing unit 5080. The signal processing unit 5080 performs predetermined signal processing on the image signal output from the photoelectric conversion apparatus 2000, and outputs image data. The signal processing unit 5080 generates an image by using the image signal.

An imaging system for acquiring images with higher image quality can be achieved by using a photoelectric conversion system configured with the photoelectric conversion apparatus according to each of the above-described embodiments.

Seventh Embodiment

Figure 16A:
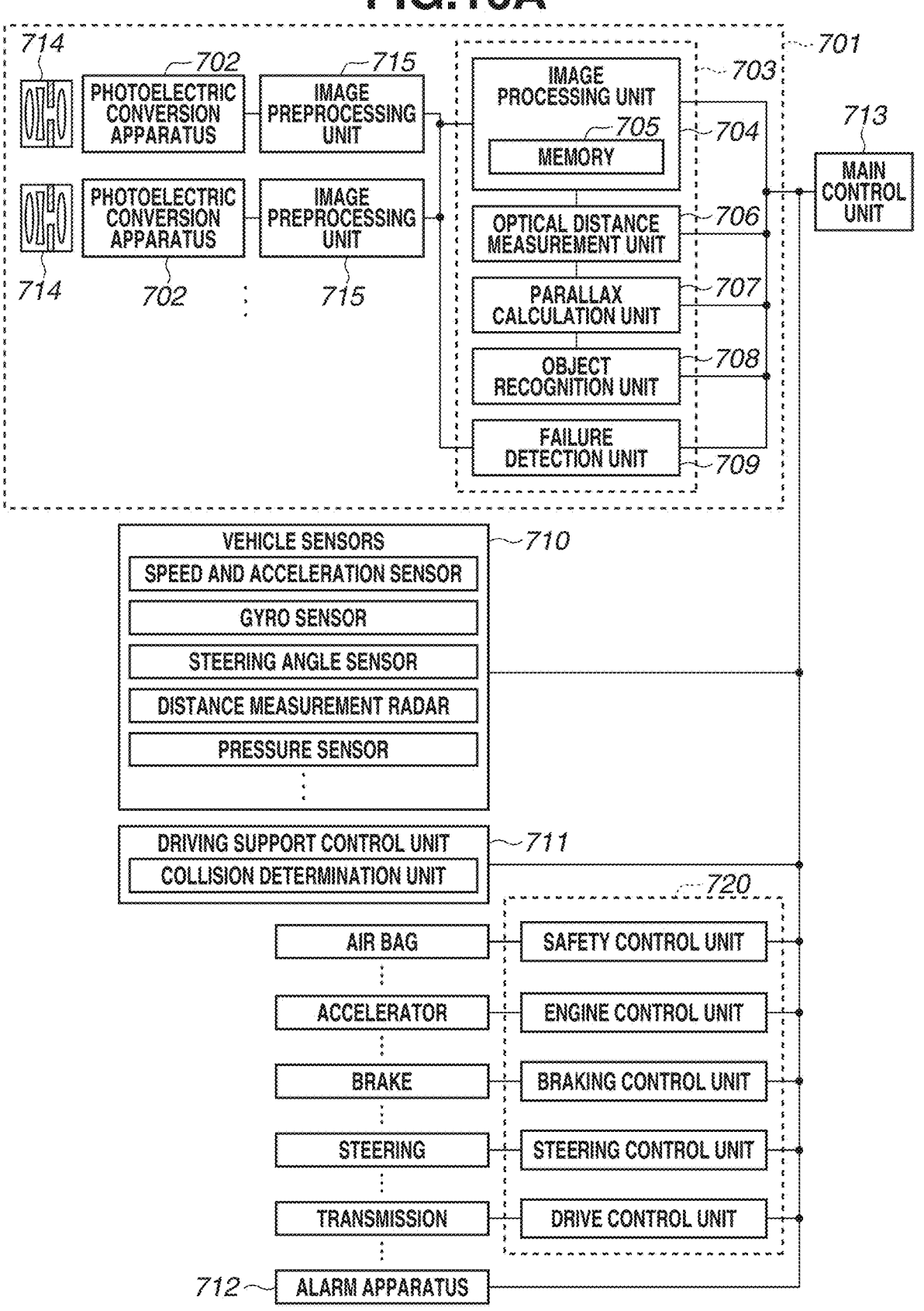
FIGS. 16A and 16B are diagram illustrating conceptual views of a photoelectric conversion system and a moving object, respectively, according to a seventh embodiment.
Figure 16B:
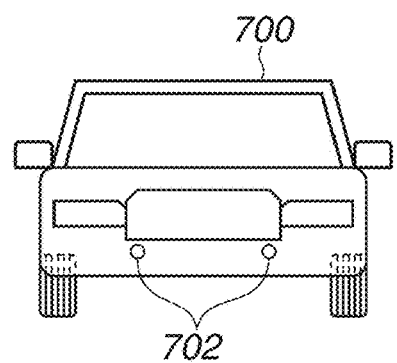
Figure 16B:
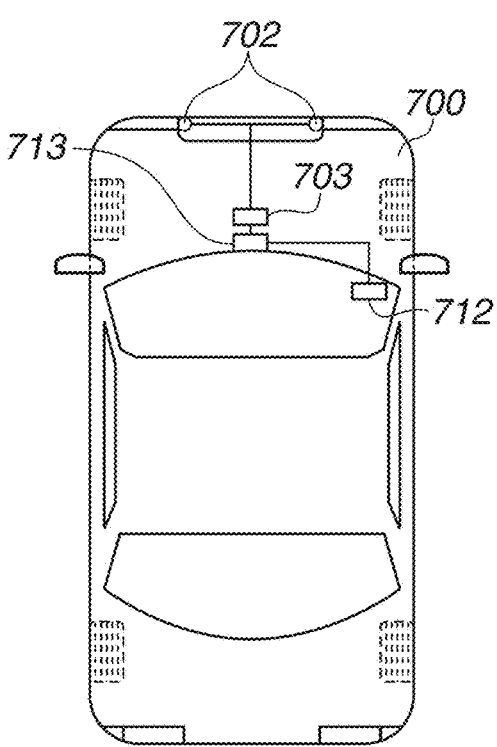
Figure 16B:
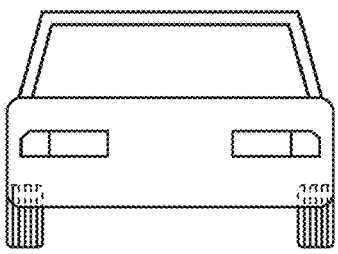

The photoelectric conversion system and the moving object according to a seventh embodiment will be described below with reference to FIGS. 16A and 16B. The present embodiment will be described below centering on an example of an imaging system related to a vehicle camera. FIGS. 16A and 16B illustrate examples of a vehicle system 700 and an imaging system mounted on the vehicle system. A photoelectric conversion system 701 includes two photoelectric conversion apparatuses 702, two image preprocessing units 715, an integrated circuit 703, and two optical systems 714. Each optical system 714 forms a subject's optical image on a photoelectric conversion apparatus 702. Each photoelectric conversion apparatus 702 converts the subject's optical image formed by an optical system 714 into an electric signal. The photoelectric conversion apparatus 702 is the photoelectric conversion apparatus according to any one of the above-described embodiments. The image preprocessing unit 715 performs predetermined signal processing on the signal output from the photoelectric conversion apparatus 702. The photoelectric conversion system 701 includes at least two sets of the optical system 714, the photoelectric conversion apparatus 702, and the image preprocessing unit 715. The output signal from the image preprocessing unit 715 of each set is input to the integrated circuit 703.

The integrated circuit 703 that is an integrated circuit for applications of the photoelectric conversion system 701 includes an image processing unit 704 including a memory 705, an optical distance measurement unit 706, a parallax calculation unit 707, an object recognition unit 708, and a failure detection unit 709. The image processing unit 704 performs image processing, such as developing processing and defect correction, on the output signal from the image preprocessing unit 715. The memory 705 primarily stores captured images and stores defective positions of imaging pixels. The optical distance measurement unit 706 performs focusing and distance measurement of a subject. The parallax calculation unit 707 calculates the parallax (phase difference of a parallax image) based on a plurality of image data pieces acquired by a plurality of the photoelectric conversion apparatuses 702. The object recognition unit 708 recognizes subjects, such as cars, paths, signs, and persons.

The failure detection unit 709 issues an alarm to a main control unit 713, upon detection of a failure.

The integrated circuit 703 may be implemented by specially designed hardware, software modules, or a combination of both. The integrated circuit 703 may also be implemented by a Field Programmable Gate Array (FPGA), an Application Specific Integrated Circuit (ASIC), or a combination of both.

The main control unit 713 totally controls operations of the photoelectric conversion system 701, vehicle sensors 710, and a control unit 720. A method that does not use the main control unit 713 may be applicable. In this method, each of the photoelectric conversion system 701, the vehicle sensors 710, and the control unit 720 includes a communication interface and transmits and receives control signals via the communication network (for example, based on the CAN standard).

The integrated circuit 703 has a function of transmitting control signals and setting values to the photoelectric conversion apparatus 702 upon receipt of control signals from the main control unit 713 or via its own control unit. For example, the integrated circuit 703 transmits a setting for driving a voltage switch in the photoelectric conversion apparatus 702 with a signal, and a setting for changing the voltage switch for each frame.

The photoelectric conversion system 701 connected to the vehicle sensors 710 can detect vehicle running states (including the vehicle speed, yaw rate, and steering angle), the environment outside the vehicle, and states of other vehicles and obstacles. The vehicle sensors 710 also serve as distance information acquisition units for acquiring information about the distance from a parallax image to a target. The photoelectric conversion system 701 is connected to a driving support control unit 711 that performs various driving support functions such as automatic steering, automatic cruising, and collision prevention functions. In particular, a collision determination function presumes and determines a collision with other vehicles and obstacles based on detection results by the photoelectric conversion system 701 and the vehicle sensors 710. Based on the determination, collision avoidance control is performed when a collision is presumed and a safety apparatus is activated when a collision takes place.

The photoelectric conversion system 701 is also connected to an alarm apparatus 712 that issues an alarm to the driver based on a determination result by a collision determination unit. For example, if the possibility of collision is high based on the determination result by the collision determination unit, the main control unit 713 performs vehicle control for avoiding a collision and reducing damages, for example, by applying brakes, releasing the accelerator, or restraining the engine power. The alarm apparatus 712 warns the driver by generating an alarm sound, displaying alarm information on the display screen of a car navigation system or meter panel, or applying a vibration to the seat belt or steering.

According to the present embodiment, the photoelectric conversion system 701 captures images of the surrounding of a vehicle, for example, images ahead or behind the vehicle. FIG. 16B illustrates an example of a layout of the photoelectric conversion system 701 in a case where images ahead of the vehicle are captured by the photoelectric conversion system 701.

Although the present embodiment has been described above centering on control for avoiding a collision with other vehicles, it is also applicable to automatic driving control for following another vehicle and retaining the vehicle within a lane. The photoelectric conversion system 701 is applicable not only to vehicles but also to moving objects (moving apparatuses), such as vessels, airplanes, and industrial robots. In addition, the photoelectric conversion system 701 is applicable not only to moving objects but also to intelligent transport systems (ITS's) and a wide range of apparatuses utilizing object recognition.

Eighth Embodiment

The photoelectric conversion apparatus according to an eighth embodiment will be described below with reference to FIGS. 17 and 18. The photoelectric conversion apparatus according to the eighth embodiment differs from the photoelectric conversion apparatus according to the first embodiment in that some of a plurality of pixels 10 disposed in a pixel region 100 are light-shielded. A pad region 27 provided with pads 28 is disposed in the semiconductor element layer 11. Since the points and configurations other than the following configurations are similar to those according to the first embodiment, and redundant descriptions thereof will be omitted.

Figure 17:
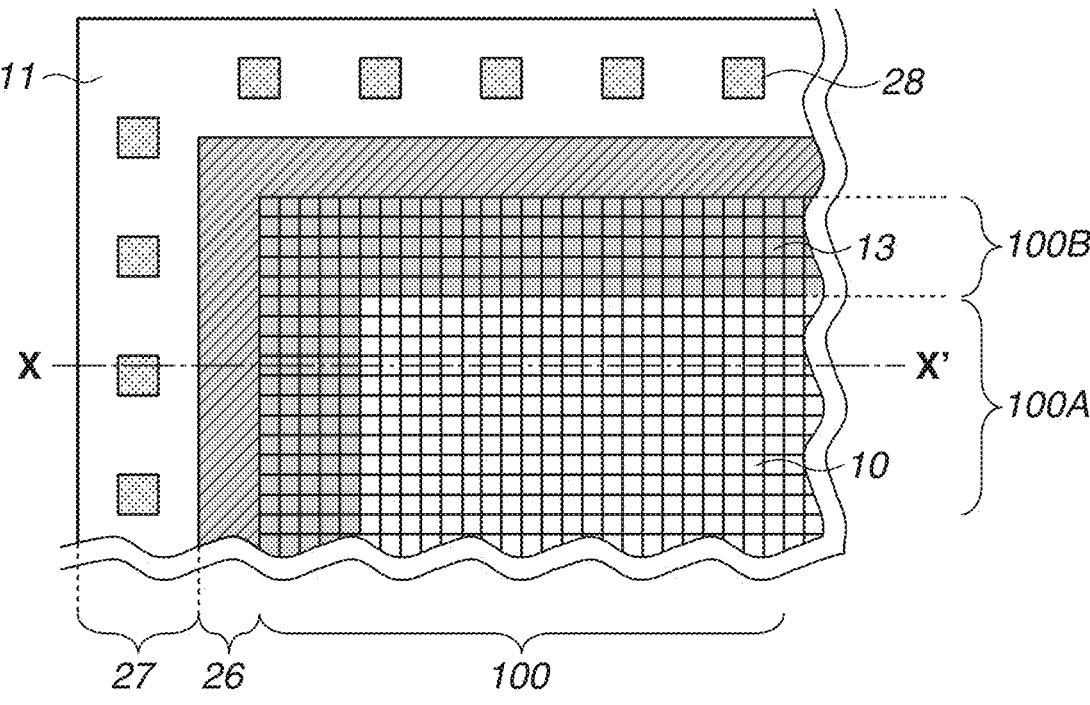
FIG. 17 is a schematic diagram illustrating a top view of a photoelectric conversion apparatus according to an eighth embodiment.

FIG. 17 is a plan view illustrating a corner of the semiconductor element layer 11. FIG. 18 is a cross-sectional view taken along the line X-X' illustrated in FIG. 17. As illustrated in FIG. 17, the pad region 27 provided with a plurality of the pads 28 is disposed in the circumference of the pixel region 100 in a plan view. Each pad 28 supplies power to the photoelectric conversion apparatus and a signal processing apparatus disposed outside the photoelectric conversion apparatus. The plurality of the pads 28 includes pads for outputting a signal from the photoelectric conversion apparatus to the outside, and pads for inputting the power voltage to the photoelectric conversion apparatus. The pads for inputting the power voltage and the pads for outputting a signal can be disposed at certain positions. For example, the pads for inputting the power voltage and the pads for outputting a signal may be alternately disposed. Alternatively, the pads for outputting a signal may be disposed at predetermined intervals, and the pads for inputting the power voltage may be disposed the pads for outputting a signal. The pads for outputting a signal may be collectively disposed, and the pads for inputting the power voltage may be disposed in other regions.

A power source region 26 is disposed between the pad region 27 and the pixel region 100. For example, the boundary between the pad region 27 and the power source region 26 can be prescribed by a light shielding film 13. The region not provided with the photoelectric conversion element but provided with the light shielding film 13 can be defined as the power source region 26. The region ranging from the end of the light shielding film 13 to the end of the semiconductor element layer 11 can be defined as the pad region 27.

The light shielding film 13 is disposed to overlap with a plurality of pixels 10 disposed in the vicinities of the power source region 26 and the pad region 27 in a plan view. Pixels overlapping with the light shielding film 13 in a plan view can function as optical black pixels (OB pixels) for detecting the reference value of the black level. As illustrated in FIG. 17, the pixel region 100 includes an OB pixel region 100B including a plurality of OB pixels, and an effective pixel region 100A not including the light shielding film 13 but including light incidence pixels on which light is incident.

Figure 18:
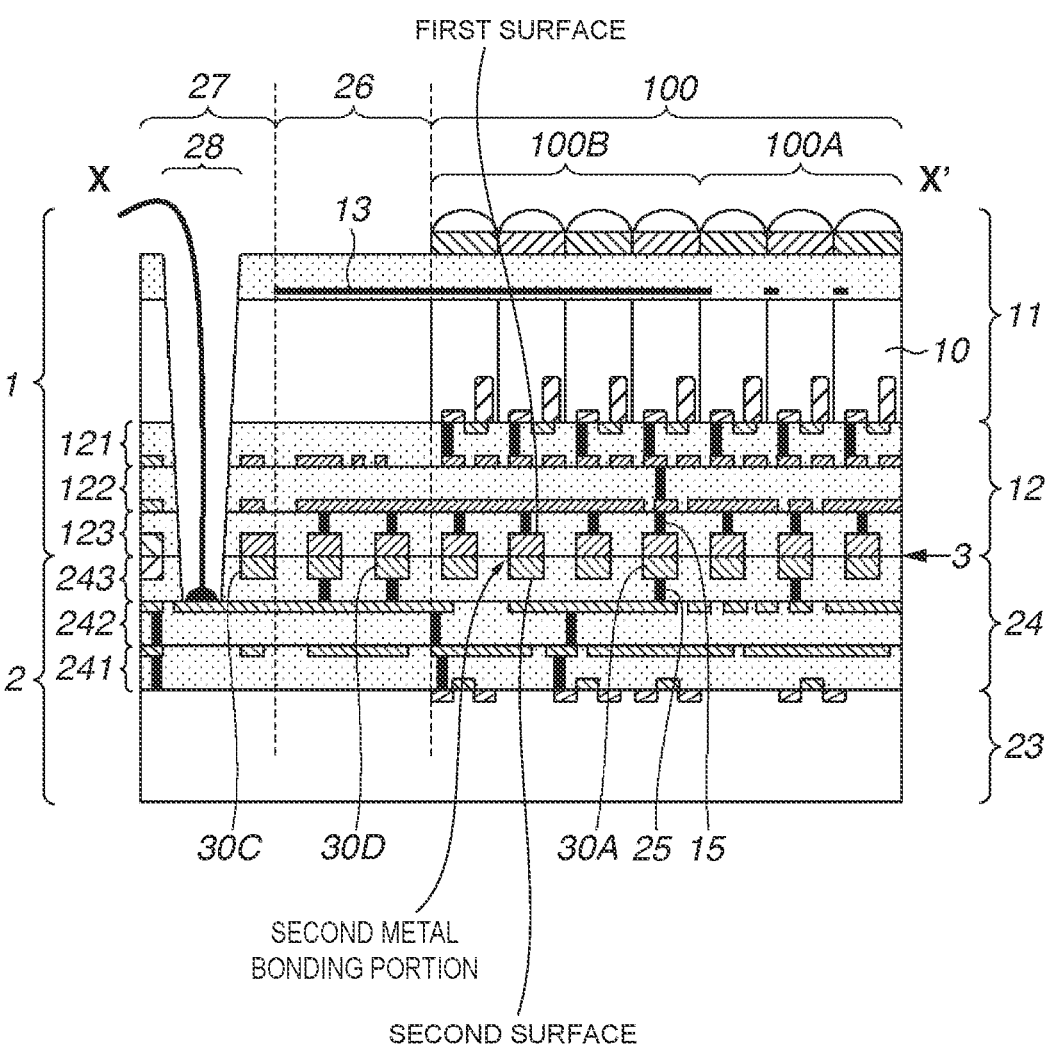
FIG. 18 is a diagram illustrating a schematic cross-sectional view taken along the line X-X' according to the eighth embodiment.

As illustrated in FIG. 18, the pad 28 includes a trench penetrating through the semiconductor element layer 11. The trench is formed in the depth direction from the light incidence surface of the semiconductor element layer 11 up to the depth of the wiring pattern in the wiring layer 242 of the chip 2. In the pad 28, a wire bonding is provided for continuity to the wiring layer 242 formed on the chip 2.

The metal bonding portions 30A is disposed in the OB pixel region 100B. Referring to FIG. 18, the metal bonding portion 30A is connected to the semiconductor element layers 11 and 23. The metal bonding portion 30A disposed in the OB pixel region 100B illustrated in FIG. 18 outputs the signal of the OB pixel to the semiconductor element layer 23. The OB pixel region 100B may include a metal bonding portion connected to either one of the semiconductor element layers 11 and 23 and not connected to the other thereof.

The metal bonding portion 30D for inputting the power voltage (input from the pad 28) to the semiconductor element layers 11 and 23 is disposed in the power source region 26. The metal bonding portion 30D disposed in a region not overlapping with the pixel region 100 in a plan view connects the semiconductor element layers 11 and 23. The power voltage is input to the pixels of the semiconductor element layer 11 via the metal bonding portion 30D. When supplying a common power voltage to the semiconductor element layer 11 and 23, the power voltage input from the pad 28 can be supplied to the semiconductor element layers 11 and 23 via the metal bonding portion 30D.

The metal bonding portions 30C connected to none of the semiconductor element layers 11 and 23 is disposed in the pad region 27. This enables ensuring the bonding strength between the chips 1 and 2.

The pad 28 for supplying the power voltage may be divided for each semiconductor element layer. For example, a certain pad 28 may be configured to supply the power voltage to the semiconductor element layer 11 but not to supply the power voltage to the semiconductor element layer 23. In addition, another pad 28 may be configured to supply the power voltage to the semiconductor element layer 23 but not to supply the power voltage to the semiconductor element layer 11. In this case, the metal bonding portion 30B is disposed in the power source region 26.

Pads for supplying the power voltage to the semiconductor element layers 11 and 23 and pads for supplying the power voltage to either one of the semiconductor element layers 11 and 23 may be provided together. In the power source region 26, the metal bonding portion 30C connected to none of the semiconductor element layer 11 and 23 may be disposed to ensure the bonding strength between the chips 1 and 2. For example, in the power source region 26, the metal bonding portion 30A disposed between each pad 28 and the pixel 10 closest to a corresponding one of the pads 28 connects to the semiconductor element layers 11 and 23. The metal bonding portion 30C may be disposed as other metal bonding portions.

The pad region 27 is not connected to the pad 28, and may be provided with the metal bonding portion 30A connected to the semiconductor element layers 11 and 23 and the metal bonding portion 30B connected to either one of the semiconductor element layers 11 and 23.

Like the first embodiment, the present embodiment makes it possible to reduce an uneven output due to a dark current to a further extent than in the comparative example. Disposing the metal bonding portion 30C at a suitable position enables ensuring the bonding strength between the chips 1 and 2.

Ninth Embodiment

The photoelectric conversion apparatus according to a ninth embodiment will be described below with reference to FIGS. 19A to 19F and FIG. 21. The photoelectric conversion apparatus according to the ninth embodiment differs from the photoelectric conversion apparatus according to the eighth embodiment in that the wiring structure 12 of the chip 1 includes five different wiring layers. Since this point and configurations other than the following configurations are similar to those according to the eighth embodiment, and redundant descriptions thereof will be omitted.

Figure 21:
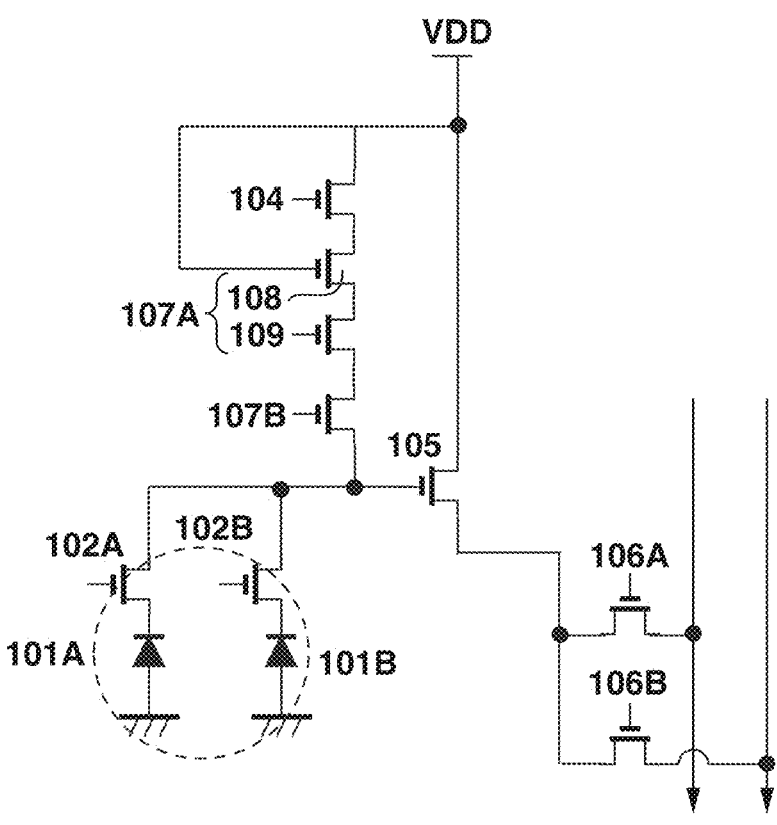
FIG. 21 is a diagram illustrating a pixel circuit diagram according to the ninth embodiment.

FIG. 21 illustrates a pixel circuit diagram according to the present embodiment. The pixel circuit according to the present embodiment differs from the pixel circuit illustrated in FIG. 2 in that the capacitance addition transistor 107A is divided into a switching transistor 109 and a capacitor 108. This makes it easier to improve the dynamic range and the linearity with the low International Organization for Standardization (ISO) sensitivity. The gate electrode of the switching transistor 109 is controlled by the control line, and the gate of the capacitor 108 is supplied with a fixed power voltage (e.g., VDD).

The wiring structure 12 includes the wiring layer 121 (metal 1), the wiring layer 127 (metal 2), the wiring layer 126 (metal 3), the wiring layer 125 (metal 4), the wiring layer 122 (metal 5), and the wiring layer 123 (metal 6) in order from the semiconductor element layer 11.

Figure 19A:
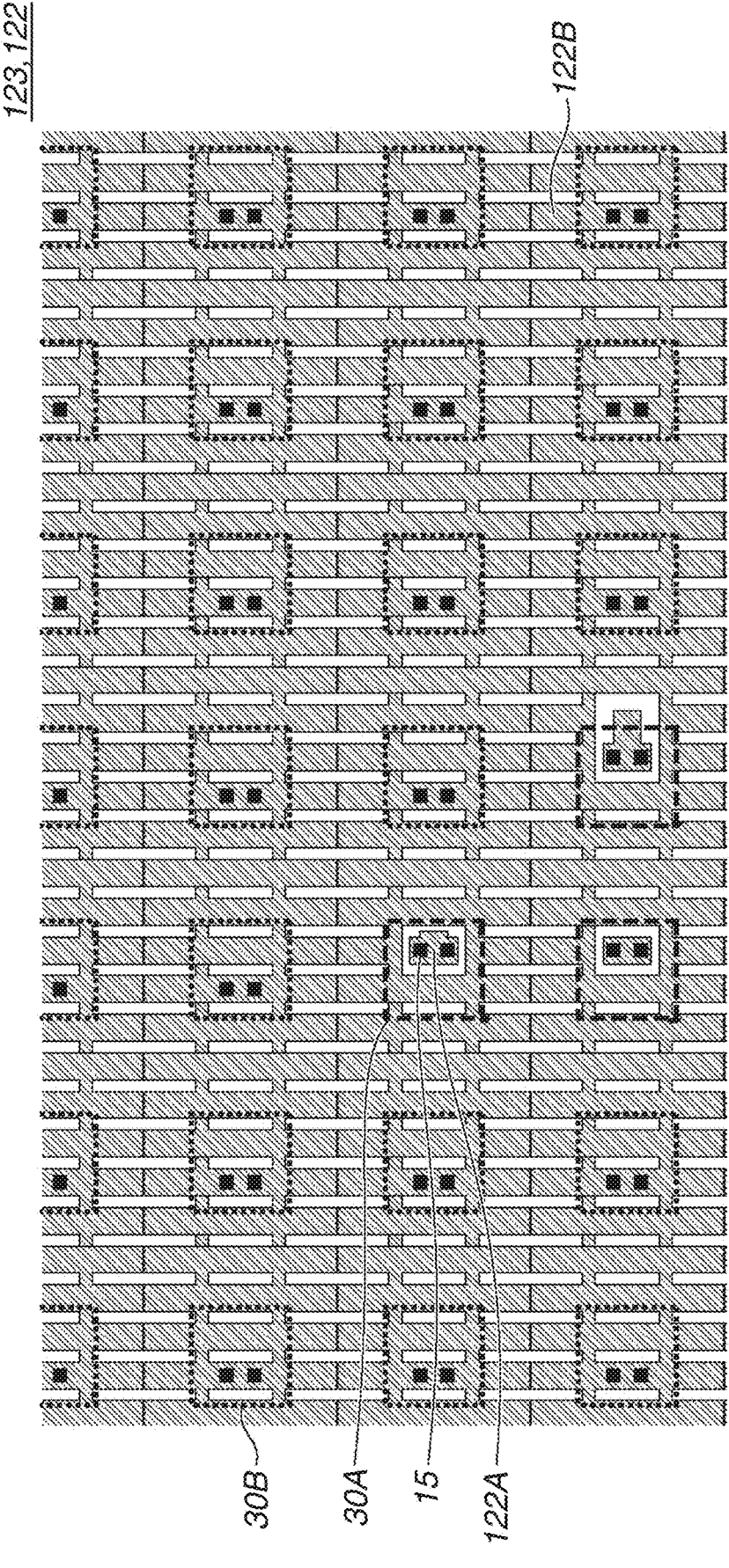

FIG. 19A is a plan view illustrating the layout of the wiring layer 123, the wiring layer 122, and the via plugs 15 for connecting the wiring layers 123 and 122. As described above, the wiring layer 123 has a wiring pattern for forming a metal bonding portion. Wiring patterns in the wiring layer 123 are drawn with broken lines or dotted lines. The wiring pattern 122A in the wiring layer 122 is connected to the metal bonding portion 30A (connected to the semiconductor element layers 11 and 23) via the via plugs 15. The wiring pattern 122B in the wiring layer 122 is connected to the metal bonding portions 30B that is connected to the semiconductor element layer 11 but is not connected to the semiconductor element layer 23 in a region overlapping with the pixel region in a plan view. In FIG. 9A, it is not necessary that none of the metal bonding portions 30B is connected to the semiconductor element layer 23, but some of the metal bonding portions 30B may be connected to VDD of the semiconductor element layer 23. Although the present embodiment will be described below centering on an example case where the wiring pattern 122B is a VDD wiring, the present invention is not limited thereto.

The wiring pattern 122B partially forms a slit and is disposed in a mesh form in the wiring layer 122 in a plan view. Increasing the area of the wiring pattern 122B with respect to the wiring pattern A in the pixel region in this way facilitates radiation of heat from the semiconductor element layer 11.

Figure 20:
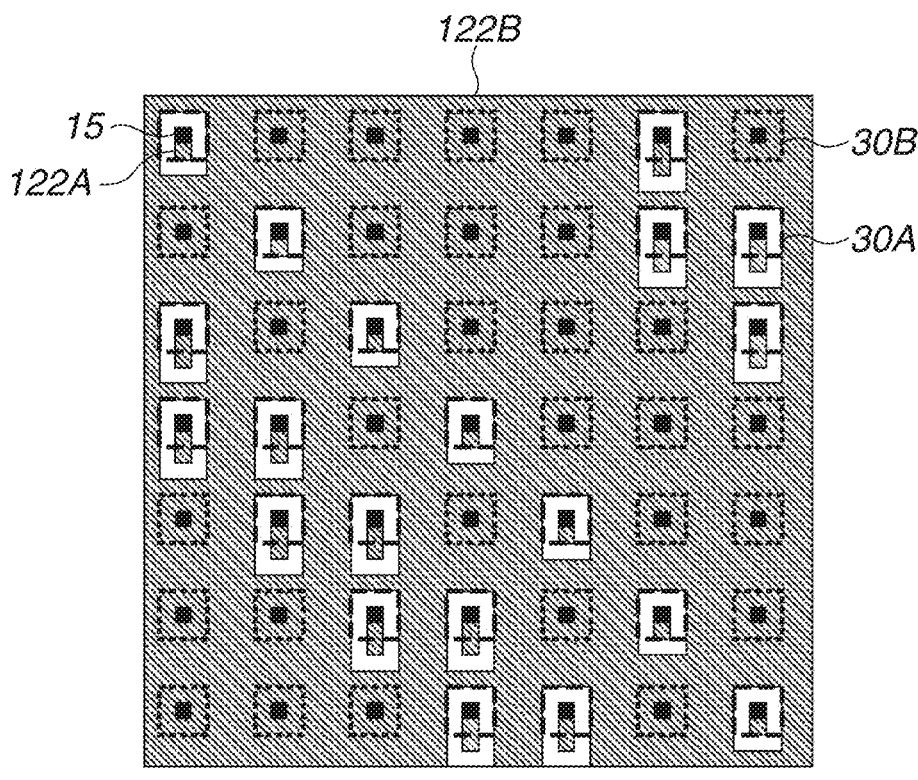
FIG. 20 is a diagram illustrating another example of a wiring layer according to the ninth embodiment.

A wiring layer as illustrated in FIG. 20 may be used instead of the wiring layer 123 illustrated in FIG. 19A. The wiring layer illustrated in FIG. 20 differs from the wiring layer illustrated in FIG. 19A in that the wiring pattern 122B is also disposed between a plurality of the metal bonding portions 30B arranged in the row, column, and diagonal directions. More specifically, the insulating material may be disposed only between the wiring patterns 122B and 122A, i.e., the wiring pattern 122B may be continuously disposed in a plan view. In this case, the area of the wiring pattern can be increased, whereby heat generated in the semiconductor element layer 11 can be easily radiated to a further extent than in the case illustrated in FIG. 19A.

Figure 19B:
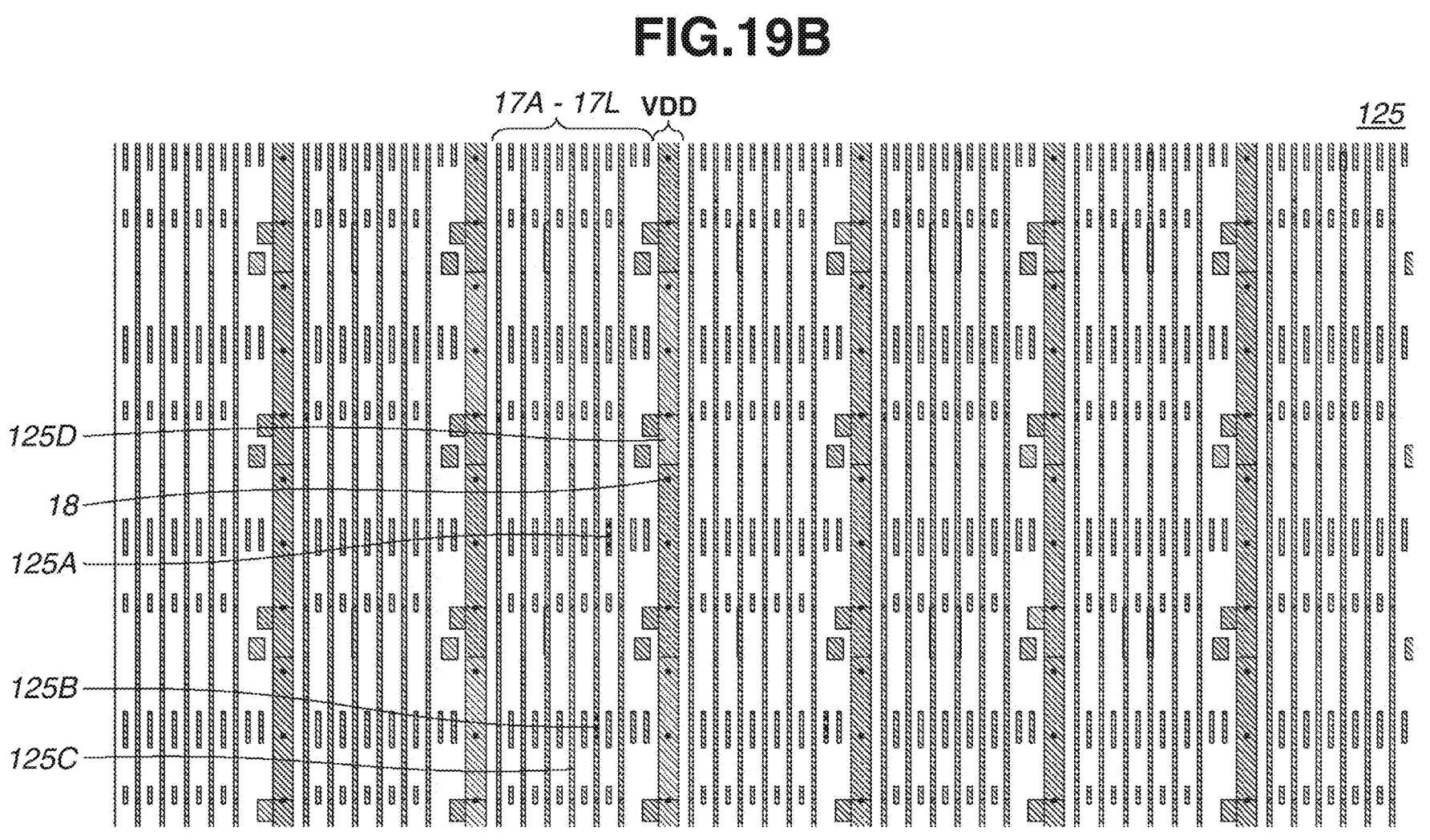

FIG. 19B is a plan view illustrating the layout of the wiring layer 125 and the via plugs 18 for connecting the wiring layers 125 and 122. The wiring layer 125 includes a wiring pattern 125D connected to the wiring pattern 122B, and wiring patterns 125A, 125B, and 125C connected to the wiring pattern 122A. The wiring pattern 125D is connected to the metal bonding portion 30B. The wiring patterns 125A, 125B, and 125C are connected to the metal bonding portion 30A. The wiring patterns 125A, 125B, and 125C form the vertical output lines 17. In FIG. 19B, since some pixels in the pixel region are magnified, the via plugs 18 are connected only to some of the vertical output lines 17. In a region not illustrated, the vertical output lines 17 are connected to the wiring pattern in the wiring layer 122 via the via plugs 18.

In the wiring layer 125, the wiring pattern 125D is thicker than the wiring patterns 125A, 125B, and 125C. This makes it easier to secure a waste heat path from the semiconductor element layer 11. In this layer, the thickness of each wiring pattern refers to the width thereof in the horizontal direction. For example, the thickness of each wiring pattern refers to the width thereof in the direction perpendicular to the longitudinal direction of the vertical output lines 17A to 17L.

Figure 19C:
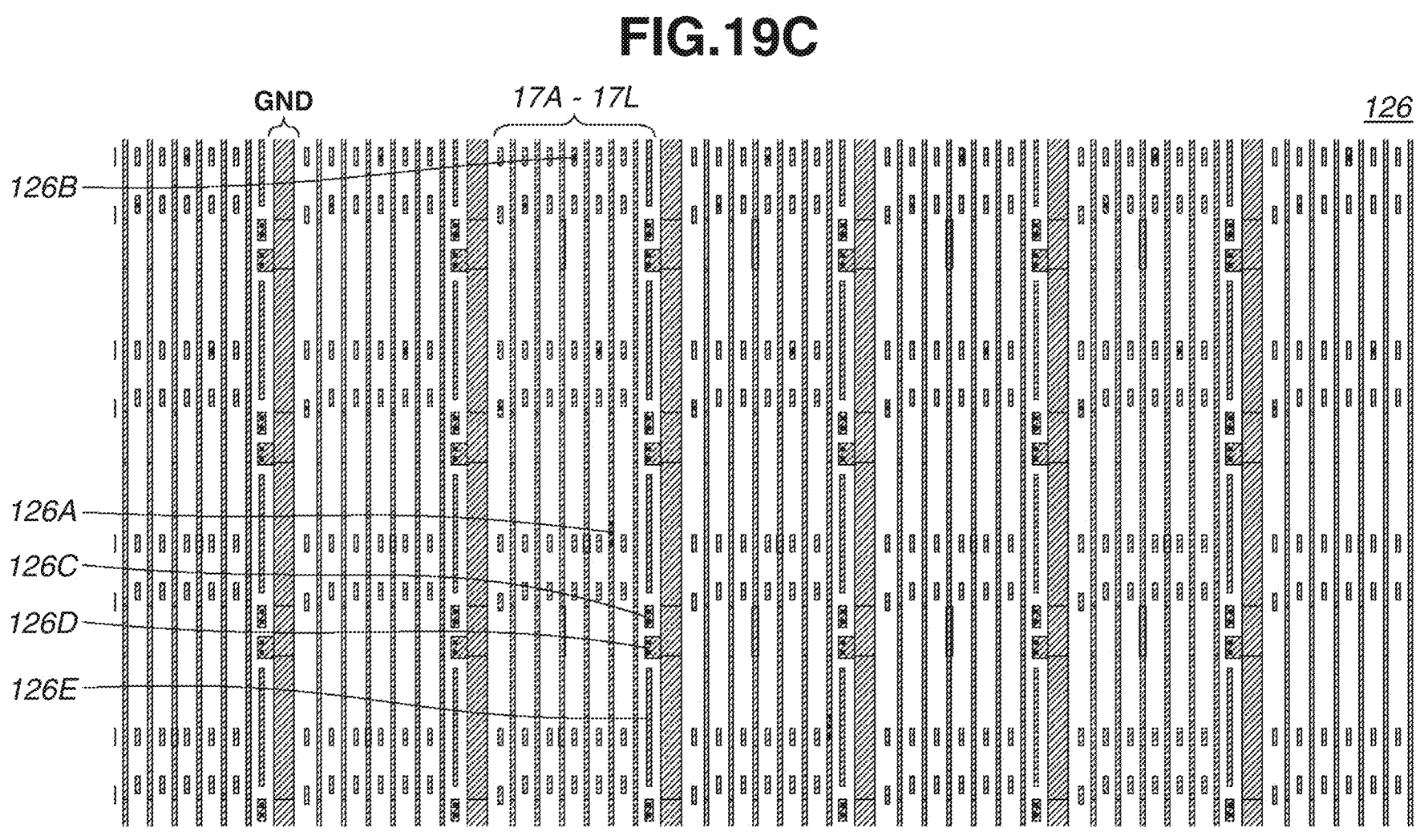

FIG. 19C is a plan view illustrating the layout of the wiring layer 126 and via plugs for connecting the wiring layers 126 and 125. Wiring patterns 126A and 126B form the vertical output lines 17. The wiring pattern 126B is connected to the wiring pattern 125C. Among the vertical output lines 17, the wiring patterns 126A, 125B, and 125C are out of pitch. More specifically, a wiring pattern that is disposed in the wiring layer 126 and extends in the column direction, like the wiring pattern 126A, does not overlap with a wiring pattern that is disposed in the wiring layer 125 and extends in the column direction, like the wiring patterns 125B and 125C, in a plan view. More specifically, vertically extending wiring patterns in the wiring layer 126 are positioned between vertically extending wiring patterns in the wiring layer 125. Signals output from pixels are read from the wiring pattern 125C via the wiring pattern 126B.

A wiring pattern 126C is connected to the wiring pattern 125D. A wiring pattern 126D is disposed in the wiring layer 126. The wiring pattern 126D forms the GND wiring.

Figure 19D:
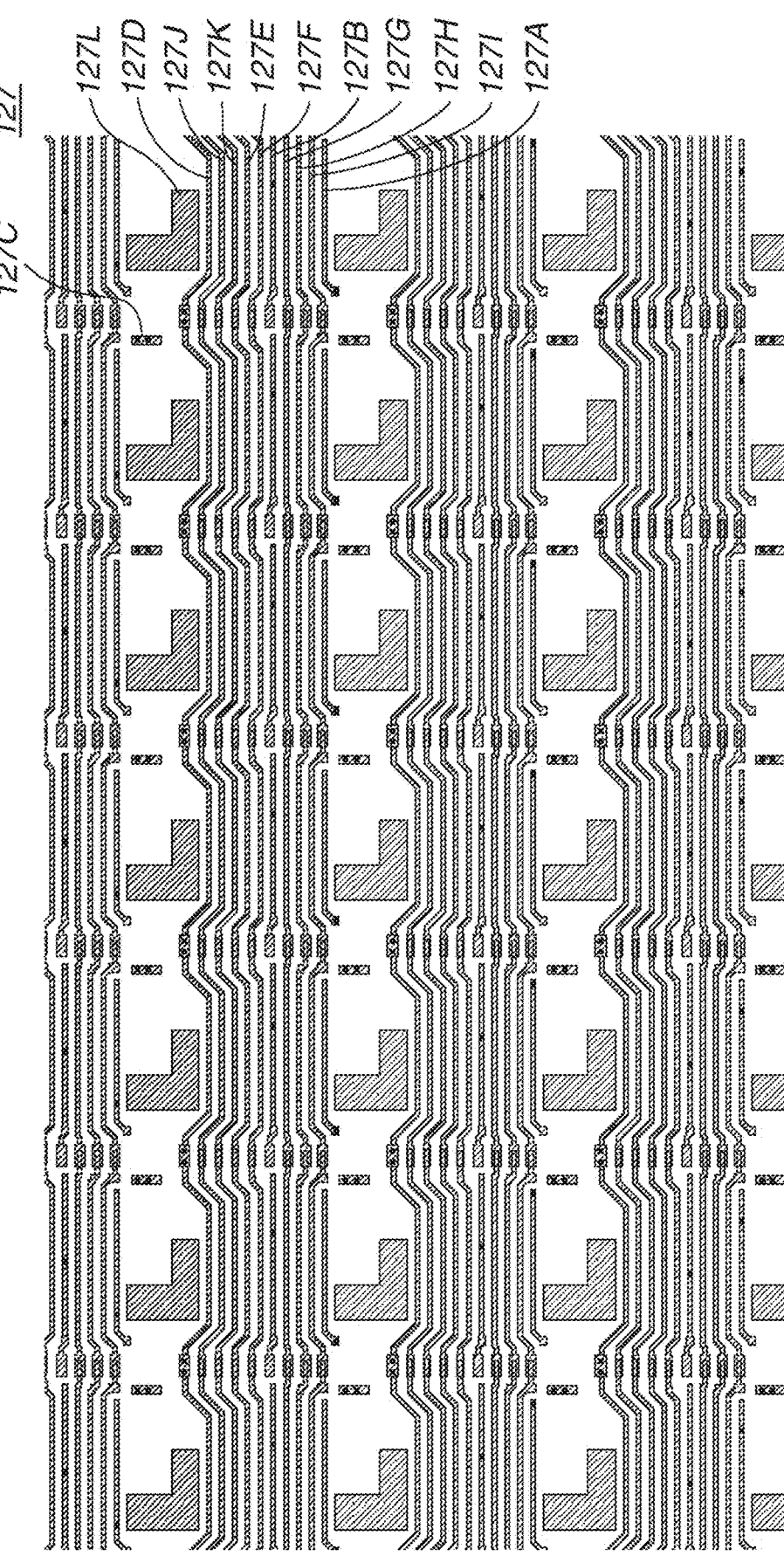

FIG. 19D is a plan view illustrating the layout of the wiring layer 127 and the via plugs for connecting the wiring layers 127 and 126. Wiring patterns 127A and 127B are connected to the vertical output lines 17. As illustrated in FIG. 19D, the positions of the via plugs are shifted for each row in the wiring patterns 127A and 127B. Thus, a connection target can be changed in the wiring layer 126 and the vertical output lines connected in the wiring layer 126 in units of row.

A wiring pattern 127C is connected to the wiring pattern 126C to form the VDD wiring. A wiring pattern 127D is connected to the wiring pattern 126D to form the GND wiring. Wiring patterns 127E to 127K are control lines for each transistor. The wiring patterns 127E to 127K are connected to a wiring pattern 126E illustrated in FIG. 19C at one or more positions for each row of the pixel array. Control pulse signals output from the row scanning circuit illustrated in FIG. 1 are supplied to the wiring pattern 126E via the metal bonding portion 30A and the via plugs. The wiring patterns 127E to 127K connected to the wiring pattern 126E via the via plugs control each transistor. A wiring pattern 127L is disposed to supply the potential of the source of the amplification transistor. The wiring pattern 127L is also disposed to overlap with the FD and the FD wiring in a plan view, thus shielding the FD.

Figure 19E:
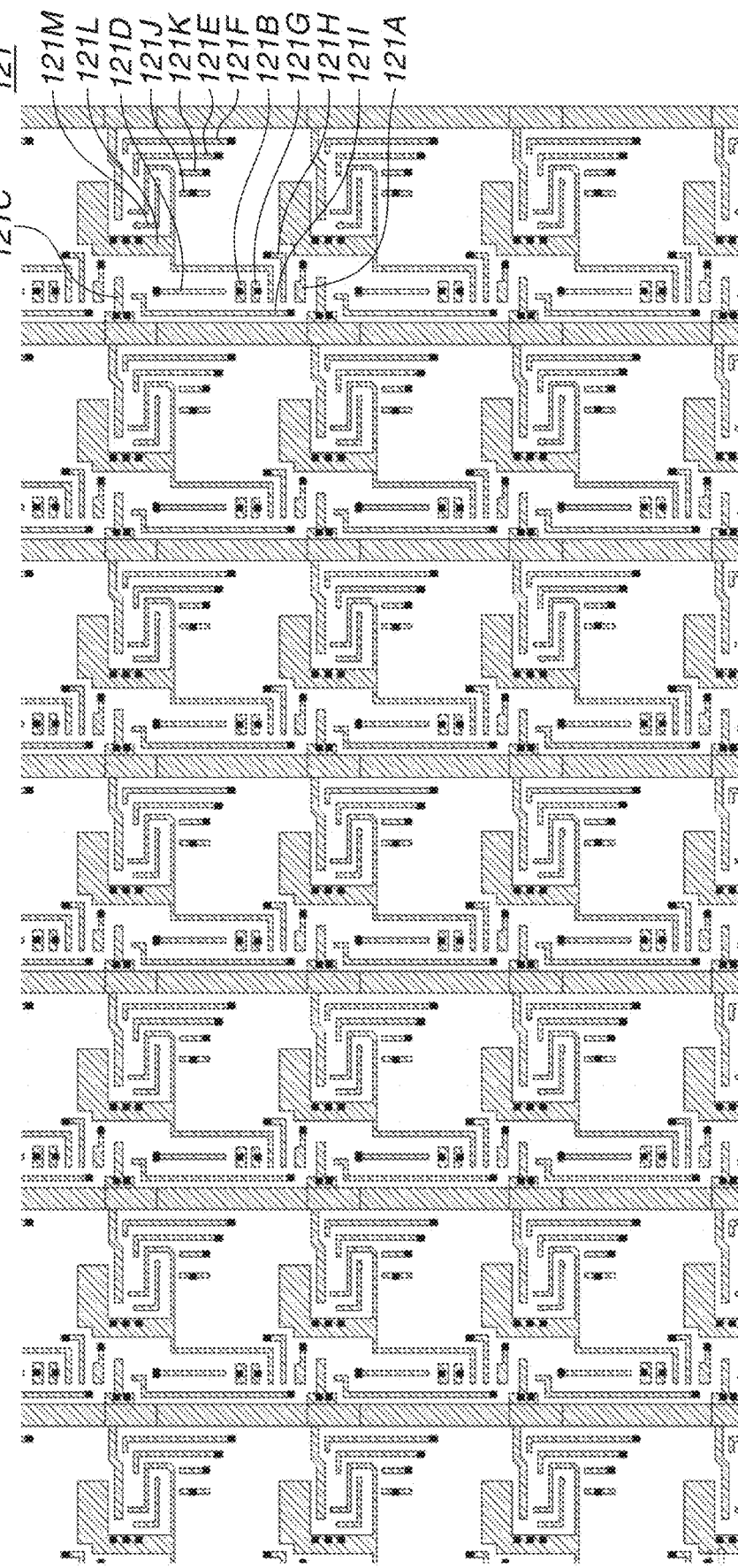

FIG. 19E is a plan view illustrating the layout of the wiring layer 121 and the via plugs for connecting the wiring layers 121 and 127. The wiring pattern 127A is connected to a wiring pattern 121A and is connected to the vertical output lines 17. A wiring pattern 121B is connected to the wiring pattern 127B and is connected to the vertical output lines 17. A wiring pattern 121C is connected to the wiring pattern 127C to form the VDD wiring. The wiring pattern 121D is connected to the wiring pattern 127D to form the GND wiring.

Wiring patterns 121E to 121K are control lines for each transistor. The connection relation between each of the wiring patterns 121E to 121K and each transistor will be described below.

A wiring pattern 121L is connected to the wiring pattern 127L. A wiring pattern 121M connects the FD and the gate of the amplification transistor.

Figure 19F:
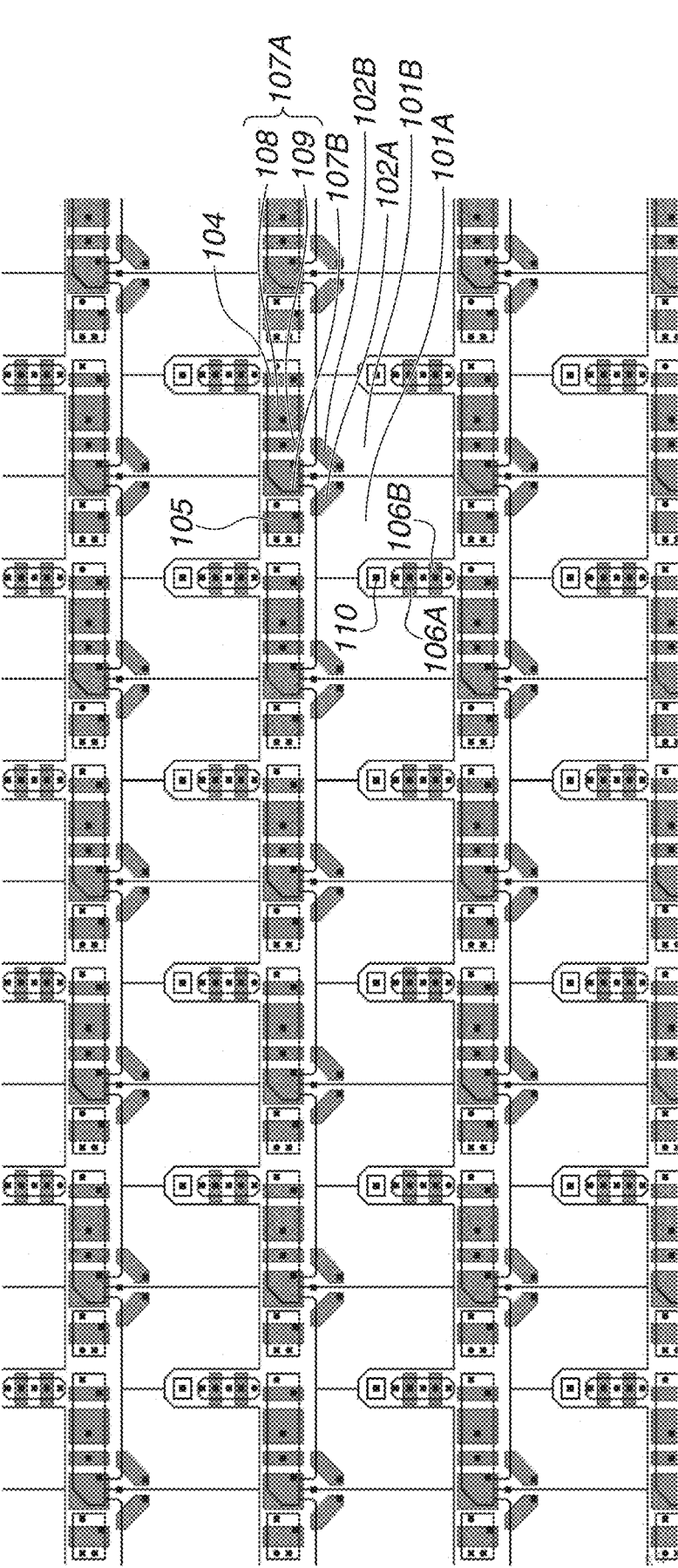
FIG. 19F is a schematic diagram illustrating a plan view of polysilicon of a wiring layer and a semiconductor region according to the ninth embodiment.

FIG. 19F is a plan view illustrating the layout of the semiconductor region and polysilicon. Reference numerals 101 to 109 correspond to the configurations of the pixel circuit diagram illustrated in FIG. 21.

The gate of the transfer transistor 102A is connected to the wiring pattern 121J. The wiring pattern 121J functions as a control line of the transfer transistor 102A. The gate of the transfer transistor 102B is connected to the wiring pattern 121K. The wiring pattern 121K functions as a control line of the transfer transistor 102B.

As described above, the FD and the gate of the amplification transistor 105 are connected by the wiring pattern 121M. The source of the amplification transistor 105 is connected to the wiring pattern 121L. The drain of the amplification transistor 105 is connected to the wiring pattern 121C to form the VDD wiring.

The gate of the capacitance addition transistor 107B is connected to the wiring pattern 121E. The wiring pattern 121E functions as a control line of the capacitance addition transistor 107B.

As described above, the capacitance addition transistor 107A includes the switching transistor 109 and the capacitor 108. The gate of the switching transistor 109 is connected to the wiring pattern 121F. The wiring pattern 121F functions as a control line of the switching transistor 109. The gate of the capacitor 108 is connected to the wiring pattern 121C.

As illustrated in FIG. 19F, the channel length of the capacitor 108 is made larger than the channel length of the switching transistor 109. This increases the capacitance of the capacitor 108, and thus the dynamic range in the low ISO sensitivity can be improved. The channel length of the switching transistor 109 is made smaller than the channel length of the capacitor 108. This improves the ON characteristics of the switching transistor 109, and thus the linearity in the low ISO sensitivity can be improved. Dividing the capacitance addition transistor 107A into the capacitor 108 and the switching transistor 109 enables changing the threshold voltages Vth of the capacitance addition transistor 107B, the capacitor 108, and the switching transistor 109. Thus, the ON and OFF characteristics of each transistor can be changed, whereby both the dynamic range and the balance linearity according to the ISO sensitivity can be achieved.

The gate of the reset transistor 104 is connected to the wiring pattern 121I. The wiring pattern 121I functions as a control line of the reset transistor 104. The drain of the reset transistor 104 is connected to the wiring pattern 121C.

The drains of the selection transistors 106A and 106B are formed of a common semiconductor region. The drains of the selection transistors 106A and 106B are connected to the wiring pattern 121L. The gate of the selection transistor 106A is connected to the wiring pattern 121H. The wiring pattern 121H functions as a control line of the selection transistor 106A. The gate of the selection transistor 106B is connected to the wiring pattern 121G. The wiring pattern 121G functions as a control line of the selection transistor 106B. The source of the selection transistor 106A is connected to the wiring pattern 121A. The source of the selection transistor 106B is connected to the wiring pattern 121B.

Each pixel includes a contact 110 for supplying a fixed potential to the well of the semiconductor element layers. The fixed potential, for example, refers to the power voltage (e.g., VDD) or the ground voltage (e.g., GND). Although it is desirable that the contact 110 is disposed in each pixel in consideration of the imaging performance for each pixel, the contact 110 may be disposed in a thinned-out way.

Like the first embodiment, the present embodiment enables reducing an uneven output due to a dark current to a further extent than in the comparative example.

Although, in the drawings according to the present embodiment, the area of the wiring pattern connected to the metal bonding portions 30B is increased in the wiring layers 125 and 122, the present invention is not limited thereto. For example, the area of the wiring pattern connected to the metal bonding portion 30B may be increased in the wiring layers 121 and 127 and other wiring layers.

OTHER EMBODIMENTS

While the present invention has specifically been described based on the above-described preferred embodiments, the present invention is not limited to these embodiments but can be modified and changed in diverse ways. These embodiments are applicable to each other.

According to the present invention, an uneven heat transfer can be reduced in a photoelectric conversion apparatus including a plurality of stacked semiconductor element layers.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-063833 filed Mar. 31, 2020, Japanese Patent Application No. 2020-191737 filed Nov. 18, 2020, and Japanese Patent Application No. 2021-017514 filed Feb. 5, 2021, which are hereby incorporated by reference herein in their entirety.

The invention claimed is:

1. A photoelectric conversion apparatus comprising:
a first chip having a first semiconductor element layer including a pixel region where a plurality of pixel circuits is disposed; and
a second chip having a second semiconductor element layer,
wherein the first chip and the second chip are bonded by a plurality of metal bonding portions between the first semiconductor element layer and the second semiconductor element layer,
wherein the plurality of metal bonding portions includes a first metal bonding portion and a second metal bonding portion that are disposed in a region overlapping with the pixel region in a plan view,
wherein the first metal bonding portion connects the second semiconductor element layer and at least one of the plurality of pixel circuits, and wherein the second metal bonding portion includes a first surface on a side of the first semiconductor element layer and a second surface on a side of the second semiconductor element layer, in the region overlapping with the pixel region in the plan view, the first surface is connected to the at least one of the plurality of pixel circuits, and the second chip has no electric path from the second surface to the second semiconductor element layer without passing through the first surface.

2. The photoelectric conversion apparatus according to claim 1, wherein a first wiring pattern and a second wiring pattern are disposed between the second semiconductor element layer and the plurality of metal bonding portions, wherein the first wiring pattern and the second wiring pattern are arranged in a same wiring layer, wherein the first metal bonding portion is connected to the first wiring pattern, and wherein the second metal bonding portion is not connected to the second wiring pattern.

3. The photoelectric conversion apparatus according to claim 2, wherein entire of the second surface of the second metal bonding portion is in contact with an insulating material.

4. The photoelectric conversion apparatus according to claim 1, wherein a first wiring pattern and a second wiring pattern are disposed between the second semiconductor element layer and the plurality of metal bonding portions, wherein the first wiring pattern and the second wiring pattern are arranged in a same wiring layer, wherein the first metal bonding portion is connected to the first wiring pattern, and wherein the second metal bonding portion is connected to the second wiring pattern, and the second wiring pattern is not connected to the second semiconductor layer.

5. The photoelectric conversion apparatus according to claim 1, wherein the first surface is in contact with a via plug.

6. The photoelectric conversion apparatus according to claim 2, wherein the second metal bonding portion includes a protruding portion connected to the second wiring pattern, and wherein the second surface is a part of the protruding portion.

7. The photoelectric conversion apparatus according to claim 1, wherein a third wiring pattern and a fourth wiring pattern are disposed between the first semiconductor element layer and the plurality of metal bonding portions, wherein the first metal bonding portion is connected to the third wiring pattern, and wherein the second metal bonding portion is connected to the fourth wiring pattern.

8. The photoelectric conversion apparatus according to claim 1, wherein a wiring supplied with a fixed voltage is connected to the second metal bonding portion.

9. The photoelectric conversion apparatus according to claim 8, wherein the wiring supplied with the fixed voltage is a VDD wiring.

10. The photoelectric conversion apparatus according to claim 1, wherein output lines are connected to the first metal bonding portion.

11. The photoelectric conversion apparatus according to claim 1, wherein copper is the primary component of the plurality of the metal bonding portions.

12. The photoelectric conversion apparatus according to claim 1, wherein each of the plurality of pixel circuits includes a photoelectric conversion element, and wherein each of the plurality of metal bonding portion is disposed to correspond with a different one of the photoelectric conversion element.

13. The photoelectric conversion apparatus according to claim 12, wherein the plurality of metal bonding portions is disposed in a plurality of rows and a plurality of columns in a plan view, and wherein, among the metal bonding portions disposed in a predetermined row, the number of second metal bonding portions is larger than the number of first metal bonding portions.

14. The photoelectric conversion apparatus according to claim 13, wherein, among the metal bonding portions disposed in a predetermined column, the number of second metal bonding portions is larger than the number of first metal bonding portions.

15. The photoelectric conversion apparatus according to claim 1, wherein, in a plan view, the area of a wiring pattern connected to the second metal bonding portion is larger than the area of a wiring pattern that is disposed in a same layer as the first metal bonding portion and is connected to the first metal bonding portion.

16. The photoelectric conversion apparatus according to claim 15, wherein, when a 1,000 μm by 1,000 μm region is viewed, the area of the wiring pattern connected to the second metal bonding portion is at least 10 times the area of the wiring pattern that is disposed in a same layer as the second metal bonding portion and is connected to the first metal bonding portion.

17. The photoelectric conversion apparatus according to claim 15, wherein the wiring pattern connected to the second metal bonding portion is disposed in a mesh form.

18. The photoelectric conversion apparatus according to claim 1, wherein the second metal bonding portion is connected to an electrical circuit disposed in the second semiconductor element layer.

19. The photoelectric conversion apparatus according to claim 18, wherein the electrical circuit is a circuit for processing signals from the pixel circuits.

20. The photoelectric conversion apparatus according to claim 1, wherein the plurality of metal bonding portions includes a third metal bonding portion not connected to the first semiconductor element layer and the second semiconductor element layer.

21. A photoelectric conversion system comprising:

the photoelectric conversion apparatus according to claim 1; and a signal processing unit configured to process a signal obtained by the photoelectric conversion apparatus.

22. A moving object comprising:

the photoelectric conversion apparatus according to claim 1;

a distance information acquisition unit configured to acquire information about a distance to a target based on a signal from the photoelectric conversion apparatus; and a control unit configured to control the moving object based on the distance information.

23. A photoelectric conversion apparatus comprising:

a first chip having a first semiconductor element layer including a pixel region where a plurality of pixel circuits is disposed, and a first wiring structure having a plurality of wiring layers; and a second chip having a second semiconductor element layer, and a second wiring structure having a plurality of wiring layers, wherein the first chip and the second chip are bonded such that the first wiring structure and the second wiring structure are bonded by a plurality of metal bonding portions between the first and the second semiconductor element layers, wherein the plurality of metal bonding portions includes a first metal bonding portion and a second metal bonding portion that are disposed in a region overlapping with the pixel region in a plan view, and entire of the first metal bonding portion and entire of the second metal bonding portion are included in the region in the plan view, wherein the first metal bonding portion connects the second semiconductor element layer and at least one of the plurality of pixel circuits, wherein the second metal bonding portion includes a first surface on a side of the first semiconductor element layer and a second surface on a side of the second semiconductor element layer, and wherein the first surface is connected to a wiring layer included in the plurality of wiring layers of the first wiring structure, and entire of the second surface of the second metal bonding portion is in contact with an insulating material.

24. The photoelectric conversion apparatus according to claim 23, wherein a first wiring pattern and a second wiring pattern are disposed between the second semiconductor element layer and the plurality of metal bonding portions, wherein the first wiring pattern and the second wiring pattern are arranged in a same wiring layer, wherein the first metal bonding portion is connected to the first wiring pattern, and wherein the second metal bonding portion is not connected to the second wiring pattern.

25. The photoelectric conversion apparatus according to claim 23, wherein the first surface is connected to the first semiconductor layer via a via plug in the region overlapping with the pixel region in the plan view.

26. A photoelectric conversion system comprising:

the photoelectric conversion apparatus according to claim 23; and a signal processing unit configured to process a signal obtained by the photoelectric conversion apparatus.

27. A moving object comprising:

the photoelectric conversion apparatus according to claim 23;

a distance information acquisition unit configured to acquire information about a distance to a target based on a signal from the photoelectric conversion apparatus; and a control unit configured to control the moving object based on the distance information.

* * * * *